(12) United States Patent
Yamaguchi

(10) Patent No.: US 7,501,891 B2
(45) Date of Patent: Mar. 10, 2009

(54) VARIABLE GAIN AMPLIFIER AND DIFFERENTIAL AMPLIFIER

(75) Inventor: Kouichiro Yamaguchi, Tokyo (JP)

(73) Assignee: Icom Incorporated (JP)

( * ) Notice: Subject to any disclaimer, the term of this patent is extended or adjusted under 35 U.S.C. 154(b) by 106 days.

(21) Appl. No.: 11/712,316

(22) Filed: Feb. 28, 2007

(65) Prior Publication Data

US 2007/0279131 A1 Dec. 6, 2007

(30) Foreign Application Priority Data

May 31, 2006 (JP) .............................. 2006-152715

(51) Int. Cl.
*H03F 3/45* (2006.01)
(52) U.S. Cl. ...................... 330/254; 330/252
(58) Field of Classification Search ................. 330/252, 330/254, 260–261
See application file for complete search history.

(56) References Cited

U.S. PATENT DOCUMENTS

| 6,600,371 | B2 | 7/2003 | Cali | |
| 7,002,411 | B2 * | 2/2006 | Yeh | ............................. 330/252 |
| 7,339,432 | B2 * | 3/2008 | Yamaguchi | ................. 330/254 |

FOREIGN PATENT DOCUMENTS

JP 2001-007667 1/2001
JP 2002-252532 9/2002

* cited by examiner

*Primary Examiner*—Robert Pascal
*Assistant Examiner*—Hieu P Nguyen
(74) *Attorney, Agent, or Firm*—Baker & McKenzie LLP

(57) ABSTRACT

A variable gain amplifier includes signal amplifying transistor and first and second gain control transistors at output and non-output sides, whose emitters are connected to collector of signal amplifying transistor.

The amplifier includes non-output load provided between collector of second gain control transistor and a power source, and equal to output load connected between collector of first gain control transistor and the power source.

The amplifier includes non-output side negative feedback path provided between collector of second gain control transistor and an input terminal of signal amplifying transistor, and formed in same circuit form with same circuit constant as a negative feedback path running from an output terminal of first gain control transistor to the input terminal.

The amplifier includes current dividing circuit which divides biasing currents between the two paths to flow the currents at same ratio as the current division ratio between first and second gain control transistors.

10 Claims, 27 Drawing Sheets

FIG. 8　　　　　　　　　　　　　PRIOR ART
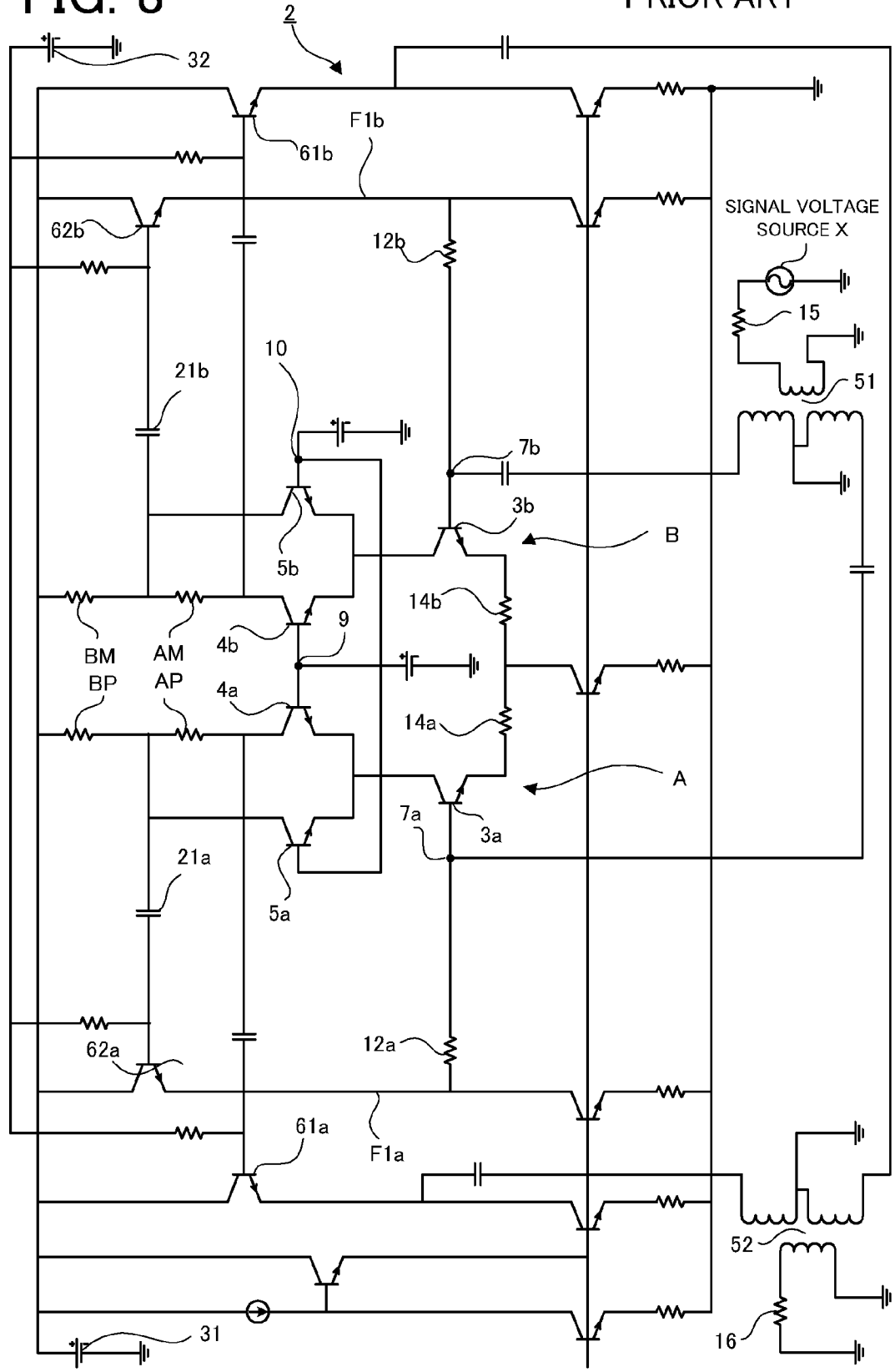

FIG. 12

NOISE FIGURE(dB) AT MAXIMUM GAIN

| SIMULATION CIRCUIT | 50MHz | 300MHz | 550MHz |
|---|---|---|---|
| EMBODIMENT 2 | 2.83 | 2.54 | 2.74 |
| EMBODIMENT 3 | 2.27 | 2.18 | 2.46 |
| CONVENTIONAL ART 1 | 2.44 | 2.14 | 2.35 |
| CONVENTIONAL ART 2 | 4.10 | 3.46 | 3.63 |
| IMPROVED EXAMPLE WITH NEGATIVE FEEDBACK EFFECT | 3.04 | 2.70 | 2.88 |

CONDITIONS SUCH AS OPERATING CURRENTS
FOR BUFFER AND VARIABLE GAIN AMPLIFIERS, ETC.
ARE EQUAL IN THESE EXAMPLES.

VARIABLE GAIN AMPLIFIER AND DIFFERENTIAL AMPLIFIER

BACKGROUND OF THE INVENTION

1. Field of the Invention

The present invention relates to a variable gain amplifier and a differential amplifier. Particularly, the present invention relates to a variable gain amplifier and a differential amplifier, which comprise a signal amplifying transistor and gain control transistors at an output side and a non-output side, whose emitters are both connected to the collector of the signal amplifying transistor.

2. Description of the Related Art

FIG. 6 shows, as conventional art 1, a simulation circuit diagram of a differential amplifier, which comprises two variable gain amplifying circuits of a conventional type. The differential amplifier having this circuit has the amount of negative feedback to signal amplifying transistors 3a and 3b changed according to the amount of currents in output transistors 4a and 4b. Particularly, this differential amplifier has a problem that almost no negative feedback functions when the gain is attenuated to the lowest level possible.

The results of operation simulations on the variable gain differential amplifier of FIG. 6 conducted by changing a gain control voltage ($V_{agc}$) of the amplifier will now be explained. FIGS. 7A to 7D are graphs respectively plotting the input transmission characteristic (hereinafter referred to as S21) of the S parameter, noise figure (hereinafter referred to as NF), the input reflection characteristic (hereinafter referred to as S11) of the S parameter, and third order input intercept point (hereinafter referred to as IIP3) indicating intermodulation distortion characteristic, which were observed at 50 MHz, 300 MHz, and 550 MHz. In the simulation of the circuit of FIG. 6, a DC voltage $V_{bias}+V_{agc}$ was applied at the node 9, while a DC voltage $V_{bias}-V_{agc}$ was applied at the node 10, giving a DC voltage difference across the nodes 9 and 10 by $2V_{agc}$. Simulation results in FIGS. 7A to 7D were plotted against $V_{agc}$ by the unit of volt (V). The half of the sum of the DC voltages at the nodes 9 and 10 is always kept at a fixed DC voltage, $V_{bias}$, irrespective of the value of the gain control voltage, $V_{agc}$. In the positive region of $V_{agc}$ in FIGS. 7A to 7D, the voltage potential of the node 9 is higher than that of the node 10, while in the negative region of $V_{agc}$, the voltage potential of the node 10 is higher than that of the node 9. Note that an input signal source impedance 15 shown in FIG. 6 is 50Ω, and an output load impedance 16 of FIG. 6 is 5 kΩ.

How the gain changed when $V_{agc}$ changed is represented by S21 of FIG. 7A. IIP3 was measured by conducting the simulations by inputting, at −50 dBm, two tone signals having center frequencies which were apart from the nominal measurement frequency by ±10 kHz. Namely in case of IIP3 measurement simulation at 50 MHz for instance, two −50 dBm tones having frequencies at 49.990 MHz and 50.010 MHz were input to the circuit in FIG. 6. The transition frequency $f_T$ of the transistors used in the simulations was 8 GHz. As the operating currents in the simulations, the current of the amplifier itself (the sum of the emitter currents of the transistors 3a and 3b in FIG. 6) was 9.6 mA, and the current in the negative feedback path (the emitter current of a transistor 62a or 62b) was 600 µA. The ratio between the operating current in the negative feedback path and the operating current of the differential amplifier at either side was set to 1:8. In FIGS. 7A to 7D, the bold line plots the simulation results at 550 MHz, the mid-size line plots at 300 MHz, and the thin line plots at 50 MHz, respectively.

As known from the characteristics of FIGS. 7A to 7D, though the circuit of the conventional art 1 had a gain variable width of about 60 dB, S11 abruptly degenerated in the negative region of $V_{agc}$, where the gain, S21, was decreased by 6 dB or more from the maximum gain, and IIP3 also degenerated simultaneously. The degeneration is because the amount of negative feedback also attenuated when the gain levels lowered.

A variable gain differential amplifier shown in a simulation circuit diagram of FIG. 8 as conventional art 2 is based on a technique published in the year 2003 in U.S. Pat. No. 6,600,371 B2. The conventional art 2 aims for solving the problem observed in the conventional art 1, i.e., the degeneration of the S11 and IIP3 characteristics when the gain lowers. Regardless of the current division ratio between two transistors 4a and 5a, and also equally between two transistors 4b and 5b in FIG. 8, the currents flowing across the resistors BM and BP have a constant value, allowing negative feedback of a constant amount to be always applied irrespective of the gain.

The results of operation simulations on the variable gain differential amplifier of FIG. 8 conducted by changing a gain control voltage will now be explained. FIGS. 9A to 9D are graphs of S21 (dB), NF (dB), S11 (dB), and IIP3 (dBm) observed at 50 MHz, 300 MHz, and 550 MHz. FIGS. 9A to 9D show the results of simulations on the circuit of FIG. 8, conducted with the same transistors, at the same operating currents, and under the same environmental conditions as used in the simulations on the circuit of FIG. 6, that are shown in FIGS. 7A to 7D. In the simulation of the circuit of FIG. 8, a DC voltage $V_{bias}+V_{agc}$ was applied at the node 9, while a DC voltage $V_{bias}-V_{agc}$ was applied at the node 10, giving a DC voltage difference across the nodes 9 and 10 by $2V_{agc}$. Here, $V_{bias}$ is a fixed DC voltage. Simulation results in FIGS. 9A to 9D were plotted against $V_{agc}$.

How the gain changed when $V_{agc}$ changed is represented by S21 of FIG. 9A. IIP3 was measured by conducting the simulations by inputting, at −50 dBm, two tone signals having center frequencies which were apart from the nominal measurement frequency by ±10 kHz. In FIGS. 9A to 9D, the bold line plots the simulation results at 550 MHz, the mid-size line plots at 300 MHz, and the thin line plots at 50 MHz, respectively.

As known from the characteristics of FIGS. 9A to 9D, the use of the circuit of FIG. 8 makes it possible for negative feedback of a constant amount to be applied even when the gain changes, which means that the deficiency in the conventional art 1 is cured. However, the circuit of FIG. 8 has the following problems.

(1) The ratio of the maximum gain to the minimum gain is determined by the ratio of the resistance between a resistor AP (AM) and a resistor BP (BM) of FIG. 8. Therefore, even in order to achieve a maximum/minimum gain ratio of mere 40 dB, a ratio of resistance of 100:1 is required. Accordingly, if these resistors are made of the same-type resistors as each other, these resistors tend to occupy large areas on the die.

(2) In order that a gain variable amount of 40 dB may be secured, the resistance of the resistor BP (BM) takes a small value particularly in a high-frequency amplifier, from the reason described above. This makes it difficult to simultaneously achieve a sufficient input reflection characteristic, a sufficient noise figure characteristic, and a sufficient intermodulation distortion characteristic, with respect to a standard input signal source of 50Ω. Accordingly, this method can hardly realize a wide band variable gain amplifier, which has a gain variable width of 40 dB or wider.

For these reasons, a gain variable width that can be realized by the conventional art 2 over a wide frequency range is at most 20 dB. Even in that case, the best values of the noise figure, the distortion, and the input reflection characteristics tend to get worse than those of the conventional art 1. In the example the circuit of FIG. 8, the gain variable width was set to 20 dB, the load resistance (resistor AM+resistor BM) was set to 135Ω, which was equal to the resistance of the resistors 6a and 6b of FIG. 6. Under these conditions, the resistor BM had a resistance of 13.5Ω. In the circuit of FIG. 8, the resistance of the resistors BM and BP are one tenth of that of the resistors 6a and 6b of FIG. 6, meaning that the voltage amplitude of an inverting amplified signal at the input of negative feedback paths, that is, at the bases of transistors 62a and 62b in FIG. 8, is also degraded to one tenth of that given by the circuit of FIG. 6, when the gain of each amplifier is set to its maximum. Therefore, unless negative feedback resistors 12a and 12b have a lower resistance than that of those in the circuit of FIG. 6, it is impossible to achieve IIP3 and S11 characteristics similar to those of the circuit of FIG. 6 and to achieve negative feedback of a sufficient amount. However, the resistance of the resistors 12a and 12b cannot be reduced without a negative effect of the NF becoming larger. In the example of the circuit of FIG. 8, the negative feedback resistance was adjusted such that the NF at the maximum gain was equal to or smaller than about 4 dB. However, as apparent from the comparison between FIGS. 9A and 9D and FIGS. 7A and 7D, the maximum S21 of the circuit of FIG. 8 was larger by about 1 to 2 dB than that of the circuit of FIG. 6, and the IIP3 of the circuit of FIG. 8 at the maximum gain was lower by about 2 to 3 dBm than that of the circuit of FIG. 6.

The technique described in the following document can be raised as another method for improving the characteristics of a variable gain amplifying circuit. Unexamined Japanese Patent Application KOKAI Publication No. 2002-252532 discloses a variable gain amplifier, in which a plurality of variable gain amplifying circuits for attenuating the gain in response to an increase in the control voltage input from the outside are connected in parallel. In this variable gain amplifier, variable gain amplifying circuits that have lower emitter resistance than other amplifying circuits are earlier than other amplifying circuits in their gains being attenuated when the control voltage for the variable gain amplifying circuits increases. Because of this structure, the noise figure characteristic and the intermodulation distortion characteristic can be satisfied at the same time, says the Publication.

Unexamined Japanese Patent Application KOKAI Publication No. 2001-7667 describes a method for reducing high-frequency noise, by connecting a load resistor between a collector of a transistor at the non-output side and a power source and by connecting a capacitor between that collector and the ground.

FIG. 10 shows an example of a circuit of a balanced variable gain amplifier with a negative feedback effect, which aims for solving the problems of the conventional arts. This is an example of a circuit which is intended for solving problems such as the degeneration of the S11 and the IIP3 when the gain lowers, observed in the conventional art 1, the narrow gain variable width and the difficulty in securing a negative feedback amount without degenerating the NF at maximum gain, observed in the conventional art 2, etc. This circuit, which is provided with two negative feedback paths in the left-hand side and also in the right-hand side respectively, with the use of emitter followers (transistors 62a, 62b, 63a, and 63b) that are connected to transistors 4a, 4b, 5a, and 5b of FIG. 10, enables negative feedback of a constant amount to be always applied regardless of the gain levels.

FIGS. 11A to 11D show characteristics of the circuit of FIG. 10 observed at 50 MHz, 300 MHz, and 550 MHz, in a case where the voltages ($2V_{agc}$) across the bases of the transistors 4a and 5a and the bases of the transistors 4b and 5b were changed. FIGS. 11A to 11D show the results of simulations on the circuit of FIG. 10, conducted with the same transistors, at the same operating currents, and under the same environmental conditions as used in the simulations on the circuit of FIG. 6, that are shown in FIGS. 7A to 7D. In FIGS. 11A to 11D, the bold line plots the simulation results at 550 MHz, the mid-size line plots at 300 MHz, and the thin line plots at 50 MHz, respectively.

As known from the characteristics of FIGS. 11A to 11D, the input reflection characteristic and the distortion characteristic of the circuit of FIG. 10 were kept almost constant regardless of the changes of the gain, and improved as compared with the conventional art 1. Further, the circuit of FIG. 10 secured gain variable widths of 55 dB or wider, and had the S11 and the IIP3 kept almost constant regardless of the gain levels with almost no degeneration in the NF at the maximum gain, showing improvement compared with the conventional art 2. However, since the circuit of FIG. 10 is provided with two additional negative feedback paths with the use of the transistors 63a and 63b as emitter followers, it has a drawback that it consumes more current than the circuits of the conventional art 1 (FIG. 6) and the conventional art 2 (FIG. 8). The circuit of FIG. 10 includes one more negative feedback path (two more paths in the case of a balanced type), compared with the conventional arts 1 and 2. Therefore, the variable gain amplifier of FIG. 10 consumes current more than the variable gain amplifiers based on the conventional arts 1 and 2 that have similar performances, by about ⅒ to ¼ of the current of the variable gain amplifier itself.

SUMMARY OF THE INVENTION

The present invention was made in view of the above-described circumstance, and an object of the present invention is to provide a variable gain amplifier which enables negative feedback of a constant amount to be always applied even when the gain is changed, and which can achieve stable amplification degree, distortion characteristic, and input reflection characteristic over a wide frequency range, with no degeneration of the input-referred noise figure at maximum gain and with no increase in the current to be consumed.

To achieve the above object, a variable gain amplifier according to a first aspect of the present invention has a signal amplifying transistor and gain control transistors at an output side and a non-output side, whose emitters are connected to a collector of the signal amplifying transistor, and comprises:

a non-output load provided between a collector of the gain control transistor at the non-output side and a power source, and equal to an output load which is connected between a collector of the gain control transistor at the output side and the power source;

a non-output side negative feedback path provided between the collector of the gain control transistor at the non-output side and an input terminal of the signal amplifying transistor, and formed in a same circuit form with a same circuit constant as those of a negative feedback path which runs from an output terminal of the gain control transistor at the output side to the input terminal; and a current dividing circuit which divides biasing currents between the negative feedback path and the non-output side negative feedback path to cause the biasing currents to flow to the paths at a same ratio as a current division ratio between the gain control transistor at the output side and the gain control transistor at the non-output side.

Particularly, the current dividing circuit may comprise a differential transistor pair, which is of a same type as the gain control transistors at the output side and the non-output side, and an output from the differential transistor pair may give operating currents to the negative feedback path and the non-output side negative feedback path.

An emitter area ratio between transistors of the differential transistor pair and the gain control transistors at the output side and the non-output side may be equal to a ratio between an amount of an input current to the current dividing circuit and an amount of an input current to the gain control transistors at the output side and the non-output side.

The gain control transistors at the output side and the non-output side may be given, between bases thereof, a same potential difference as that is given between bases of the differential transistor pair of the current dividing circuit.

The negative feedback path and the non-output side negative feedback path may be emitter followers.

A differential amplifier according to a second aspect of the present invention comprises two variable gain amplifiers each having a signal amplifying transistor and gain control transistors at an output side and a non-output side, whose emitters are connected to a collector of the signal amplifying transistor, wherein each of the variable gain amplifiers comprises:
 a non-output load provided between a collector of the gain control transistor at the non-output side and a power source, and equal to an output load which is connected between a collector of the gain control transistor at the output side and the power source; and
 a non-output side negative feedback path provided between the collector of the gain control transistor at the non-output side and an input terminal of the signal amplifying transistor, and formed in a same circuit form with a same circuit constant as those of a negative feedback path which runs from an output terminal of the gain control transistor at the output side to the input terminal, and the differential amplifier comprises two current dividing circuits which divide biasing currents between the negative feedback path and the non-output side negative feedback path to cause the biasing currents to flow into each of the paths at a same ratio as a current division ratio between the gain control transistor at the output side and the gain control transistor at the non-output side.

Particularly, each of the current dividing circuits may comprise a differential transistor pair, which is of a same type as the gain control transistors at the output side and the non-output side, and an output from the differential transistor pair may give operating currents to the negative feedback path and the non-output side negative feedback path.

An emitter area ratio between transistors of the differential transistor pair provided in each of the two current dividing circuits and the gain control transistors at the output side and the non-output side may be equal to a ratio between an amount of an input current to each of the current dividing circuits and an amount of an input current to the gain control transistors at the output side and the non-output side.

In each of the two variable gain amplifiers, the gain control transistors at the output side and the non-output side may be given, between bases thereof, a same potential difference as that that is given between bases of the differential transistor pair of the current dividing circuit.

The negative feedback path and the non-output side negative feedback path provided in each of the two variable gain amplifiers may be emitter followers.

It is preferred that the biasing currents for the emitter followers in the negative feedback path and non-output side negative feedback path be acquired from an external lower source other than the output currents from the two variable gain amplifiers.

BRIEF DESCRIPTION OF THE DRAWINGS

These objects and other objects and advantages of the present invention will become more apparent upon reading of the following detailed description and the accompanying drawings in which:

FIG. 8 is a simulation circuit diagram of a variable gain differential amplifier according to conventional art 2;

FIG. 12 is a table indicating noise figure at the maximum gain at each frequency, in each embodiment.

DETAILED DESCRIPTION OF THE PREFERRED EMBODIMENTS

Embodiment 1

Figure 1:
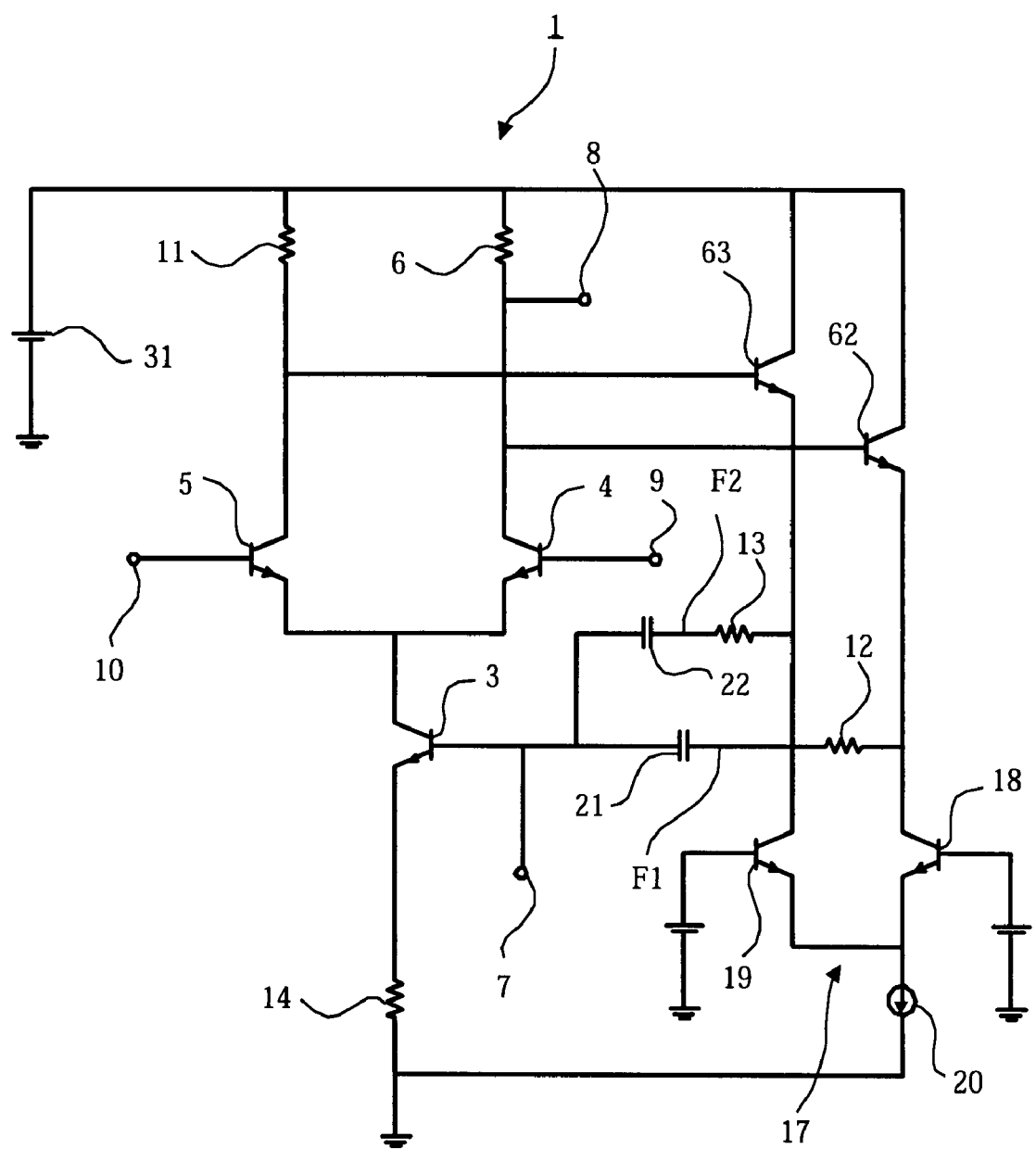
FIG. 1 is a circuit diagram showing a variable gain amplifier as one embodiment of the present invention.

One embodiment of a variable gain amplifier according to the present invention will be explained with reference to FIG. 1. FIG. 1 is a circuit diagram showing a variable gain amplifier as one embodiment of the present invention. In any circuit diagram to be shown hereafter, a T intersection is a point at which lines are connected and a crossroad is a point at which lines are not connected.

In the variable gain amplifier shown in FIG. 1, a signal amplifying transistor (hereinafter denoted as Tr) 3 has its base connected to an input terminal 7 and has its emitter grounded via a resistor 14. The collector of the signal amplifying Tr 3 is connected to the emitter of a gain control transistor 4 at an output side and to the emitter of a gain control transistor 5 at a non-output side.

The collector of the gain control transistor 4 at the output side (hereinafter referred to as output side Tr 4) is connected to a voltage source 31 via an output load 6. The collector of the output side Tr 4 is connected to an output terminal 8. Further, the collector of the output side Tr 4 is connected to the input terminal 7 via an emitter follower using a transistor 62 through a negative feedback path FI in which a capacitor 21 and a resistor 12 are connected in series.

On the other hand, the collector of the gain control transistor 5 at the non-output side (hereinafter referred to as non-output side Tr 5) is connected to the voltage source 31 via a non-output load 11 having the same resistance as the output load 6. Likewise the output side Tr 4, the collector of the non-output side Tr 5 is connected to the input terminal 7 via an emitter follower using a transistor 63, through a negative feedback path F2 in which a capacitor 22 and a resistor 13 are connected in series.

The base of the output side Tr 4 and the base of the non-output side Tr 5 are connected respectively to a $V_{agc+}$ terminal 9 and a $V_{agc-}$ terminal 10, to which a gain control voltage $V_{agc+}$ and a gain control voltage $V_{agc-}$ are input respectively.

The circuit of FIG. 1 is further provided with a current dividing circuit 17, which comprises a current dividing transistor 18 and a current dividing transistor 19 (hereinafter referred to as current dividing Tr 18 or Tr 19). The current dividing Trs 18 and 19 form a differential transistor couple of the same type as the current-dividing differential transistor couple at the upper stage of the circuit of FIG. 1, i.e., the couple of the output side Tr 4 and non-output side Tr 5.

The output of the current dividing circuit 17 is connected to the negative feedback paths F1 and F2 comprising the emitter followers.

The emitter area ratio between the current dividing Trs 18 and 19 and the output side and non-output side Trs 4 and 5 is equal to the ratio between an input current to the current dividing circuit 17 (i.e., the current of a current source 20) and an input current (the collector current of the signal amplifying Tr 3) to the current-dividing differential transistor couple at the upper stage of the circuit of FIG. 1.

The current dividing Tr 18 and the current dividing Tr 19 are provided, between the bases thereof, with the same potential difference as the potential difference between the bases of the output side Tr 4 and non-output side Tr 5, i.e., provided with the potential difference between the $V_{agc+}$ terminal 9 and the $V_{agc-}$ terminal 10.

Next, the operation of the circuit will be explained. A signal input to the input terminal 7 is supplied to the base of the signal amplifying transistor 3, and this signal is amplified as the variation of the collector current of the signal amplifying transistor 3. This collector current flows in such a way as to pull the emitters of the output side Tr 4 and non-output side Tr 5. This collector current is approximately equal to the sum of the collector currents of the output side Tr 4 and non-output side Tr 5, and is supplied from the voltage source 31 as divided into the collector currents of the output side Tr 4 and non-output side Tr 5. This control of dividing the collector current is performed by controlling the voltages to be applied to the bases of the output side Tr 4 and non-output side Tr 5.

The gain can be changed by the division of the collector current. For example, in a case where the gain should be increased, the potential difference between the gain control voltages given by $V_{agc+}-V_{agc-}$ may be increased so that the collector current of the output side Tr 4 may increase. In a case where the gain should be reduced, the potential difference between the gain control voltages given by $V_{agc+}-V_{agc-}$ may be decreased so that the collector current of the non-output side Tr 5 may increase. The gain is controlled by such a control voltage, and when an input signal is input to the input terminal 7, the collector current of the output side Tr 4 flows across the output load 6 and is thereby converted into a voltage. This output signal as converted is output from the output terminal 8.

The negative feedback path F1 starting from the collector of the output side Tr 4 has the same circuit structure as the negative feedback path F2 starting from the collector of the non-output side Tr 5 (i.e., the circuit form and the circuit constants are the same between them). When the DC base voltage of the output side Tr 4 is $V_{bias}+V_{agc}$, and the DC base voltage of the non-output side Tr 5 is $V_{bias}-V_{agc}$, (here, $V_{bias}$ refers to some fixed DC voltage), while the gain of the amplifier changes as the value of $V_{agc}$ changes, as mentioned above, the sum of each of the voltage amplitude of inverting amplified signals which appear at the base terminals of the emitter followers Trs 62 and 63 in FIG. 1 remains unchanged, keeping the total of the amounts of negative feedback almost constant, irrespective of the gain. Therefore, an almost constant input reflection characteristic can be achieved regardless of the gain and a favorable input matching characteristic can be achieved over a wide frequency range regardless of the gain. Further, an almost constant distortion characteristic can be achieved regardless of the gain.

Ideally, the current division ratio IR of a differential amplifier using bipolar transistors is given by the following equations, from a DC voltage difference $V_d$ applied to the differential input (between base terminals) of the amplifier.

$$IR = \tan h(V_d/2V_T)$$

$$V_T = kT/q$$

where k represents Boltzmann constant (J/K), T represents absolute temperature (° K), and q represents charge of an electron (C).

Specifically, in a case where ideal bipolar transistors are used, the bipolar current dividing circuits, to which the same differential input voltage is applied, give the same current division ratio as each other. In reality, bipolar current dividing circuits, which have the same emitter current value per unit emitter area as each other, give almost the same division ratio as each other, but bipolar current dividing circuits whose emitter current values per unit emitter area are different from each other produce an error in their division ratios. Therefore, to speak in the example of the circuit of FIG. 1, it is basically referred that the ratio between the input current to the current dividing circuit 17 and the input current to the current dividing circuit at the upper stage that comprises the output side Tr 4 and the non-output side Tr 5 be equal to the ratio between the emitter areas of the current dividing Trs 18 and 19 and the emitter areas of the output side Tr 4 and on-output side Tr 5.

Figure 6:
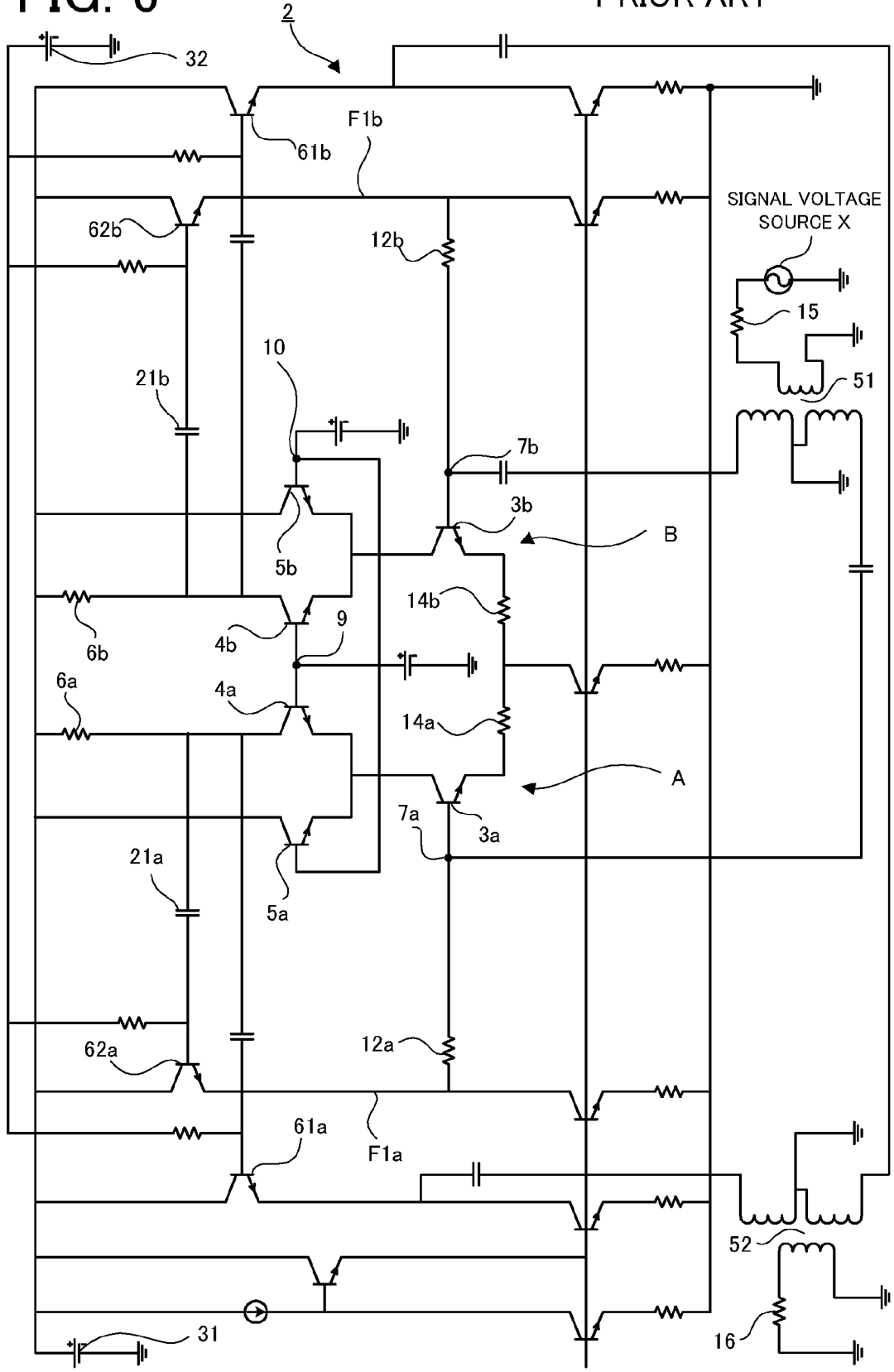
FIG. 6 is a simulation circuit diagram of a variable gain differential amplifier according to conventional art 1.
Figure 7A:
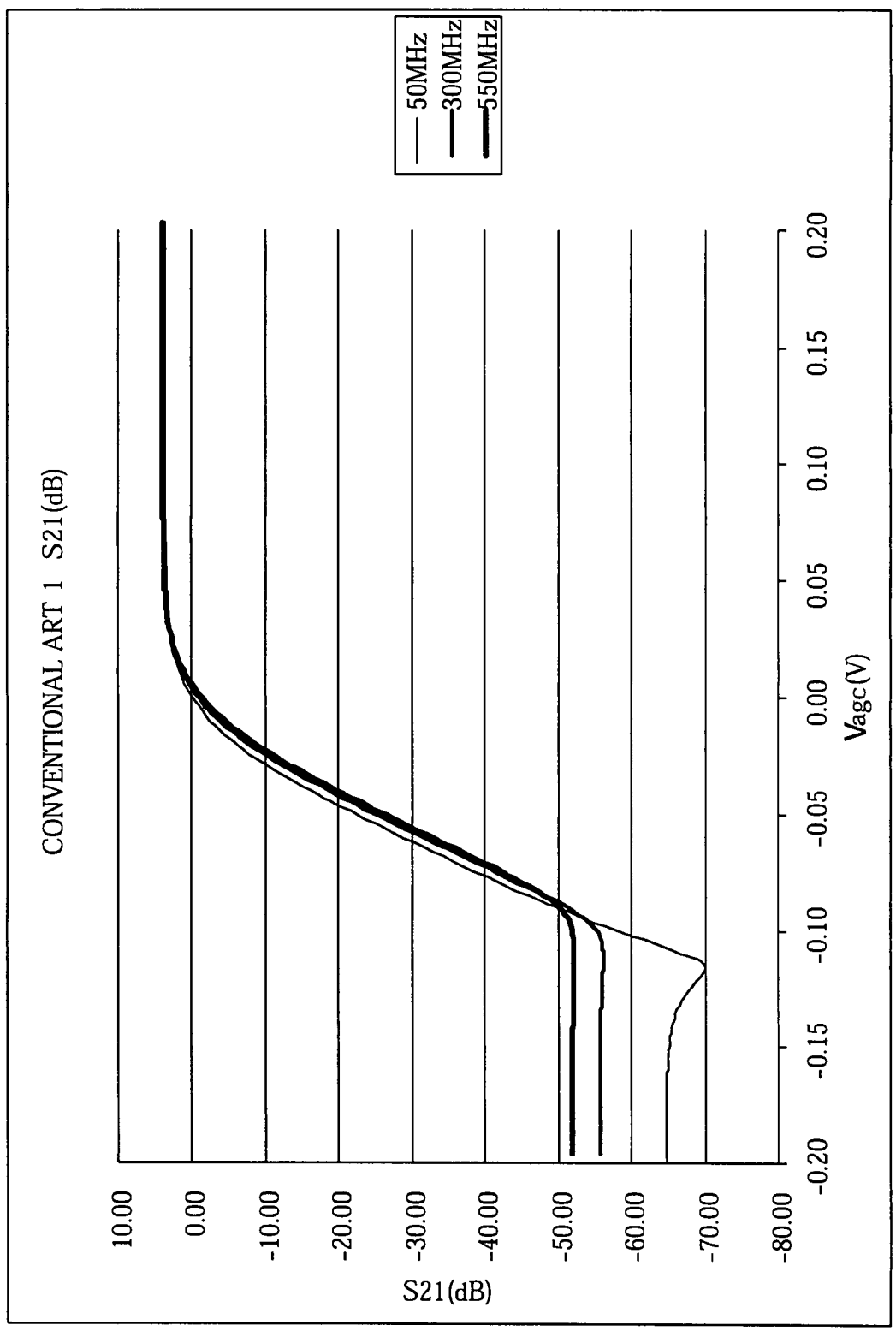
FIG. 7A is a graph plotting input transmission characteristic S21 of the S parameter, in a case where the gain control voltage is changed in the differential amplifier of FIG. 6.
Figure 7B:
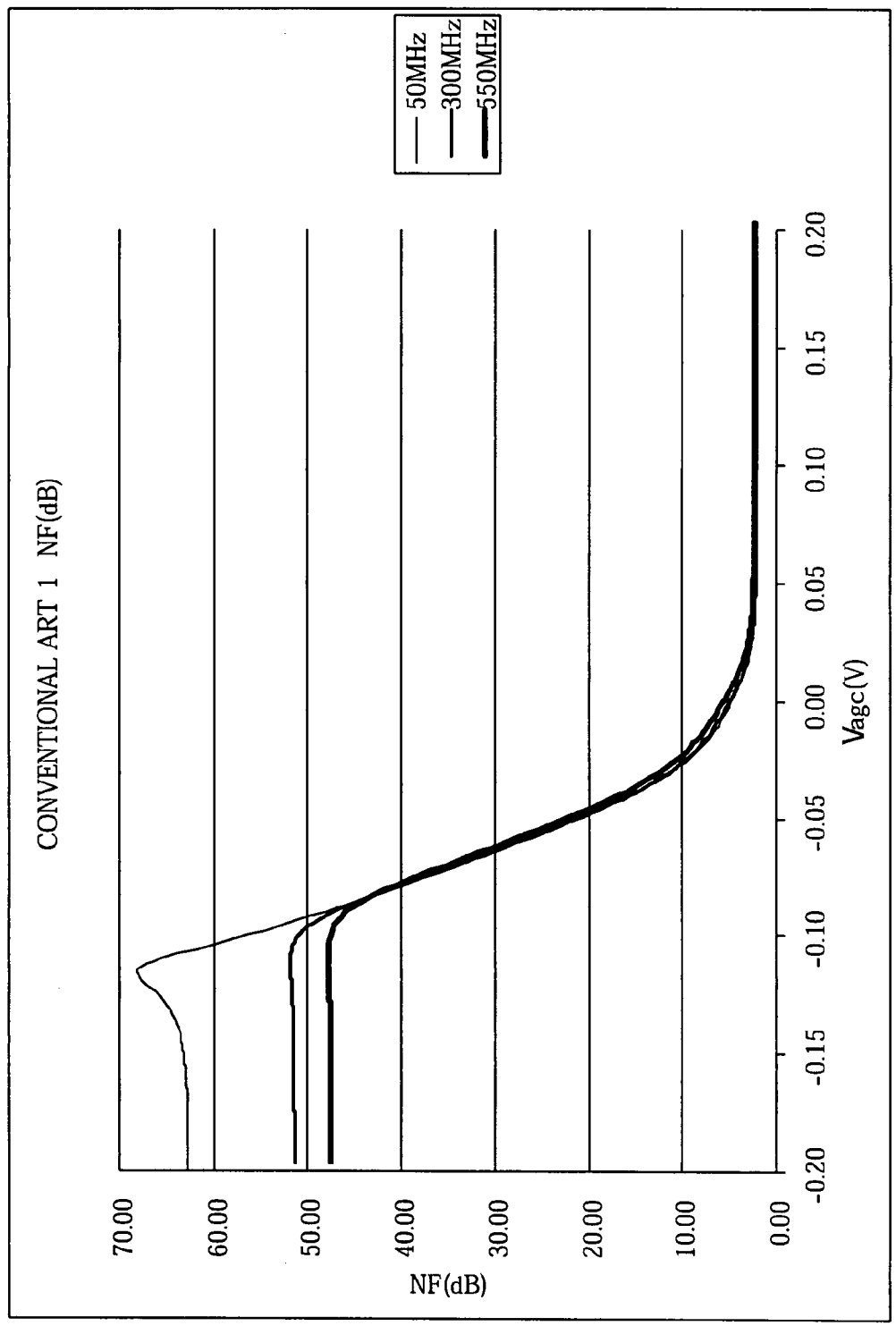
FIG. 7B is a graph plotting noise figure NF, in a case where the gain control voltage is changed in the differential amplifier of FIG. 6.
Figure 7C:
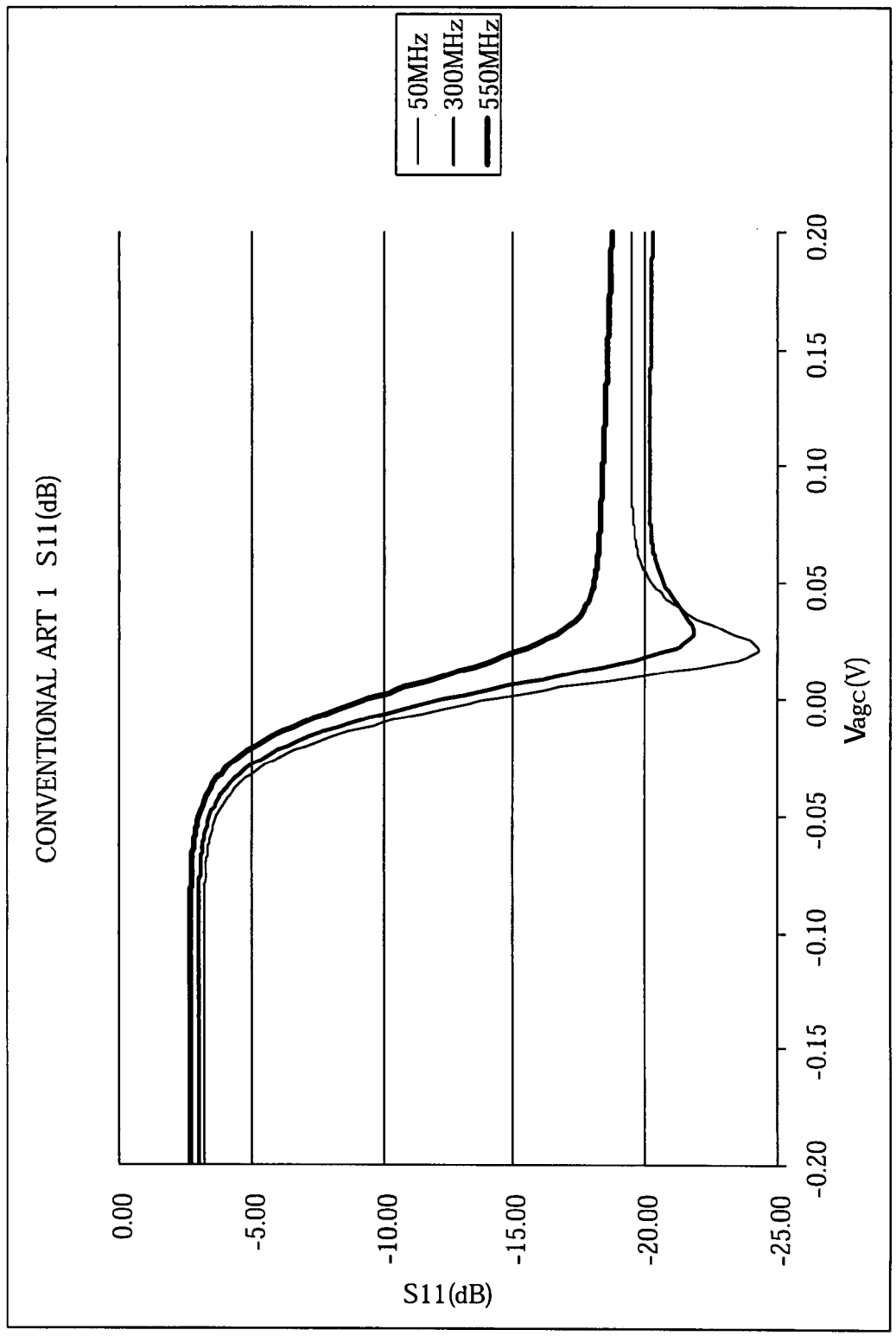
FIG. 7C is a graph plotting input reflection characteristic S11 of the S parameter, in a case where the gain control voltage is changed in the differential amplifier of FIG. 6.
Figure 7D:
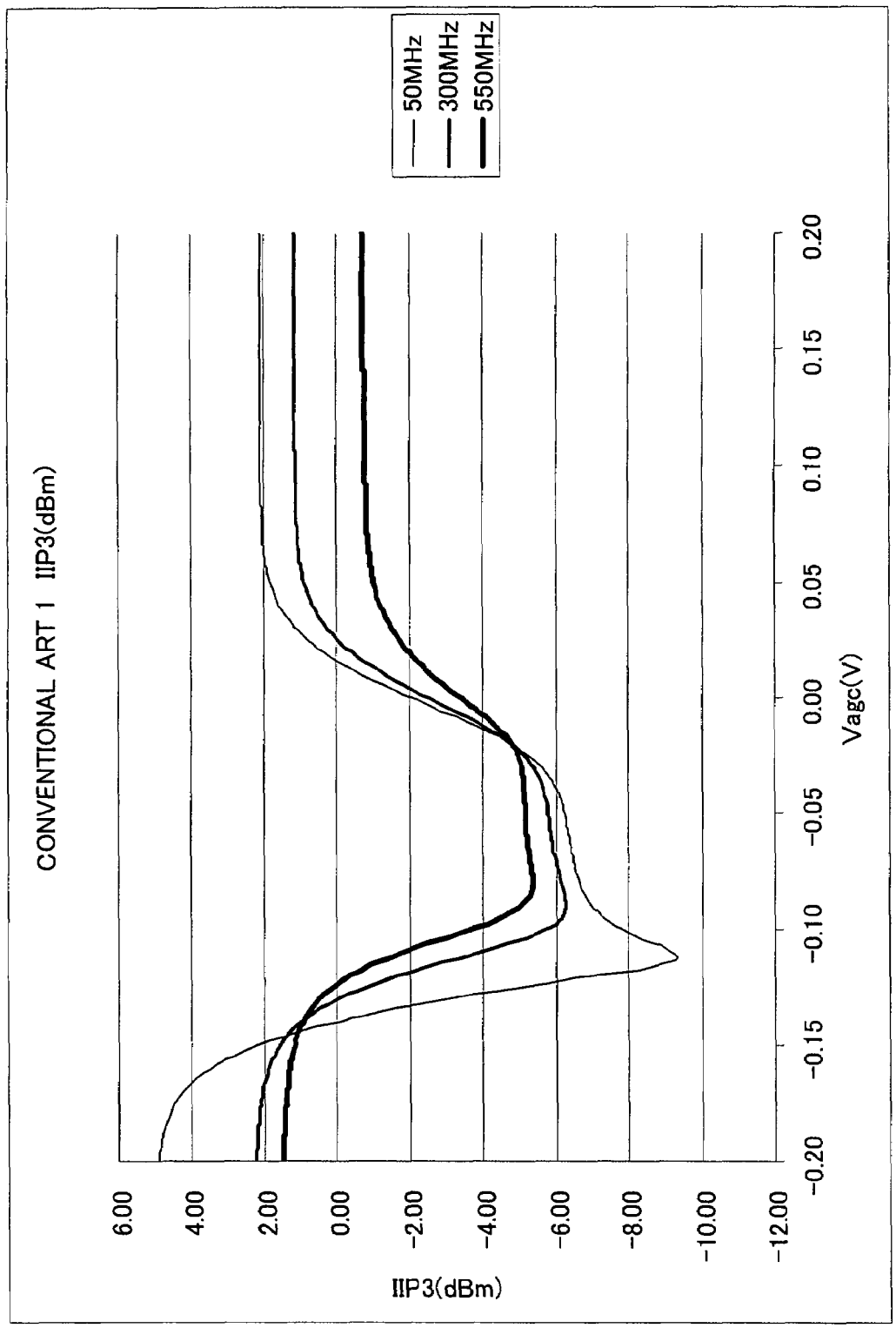
FIG. 7D is a graph plotting third order input intercept point IIP3, in a case where the gain control voltage is changed in the differential amplifier of FIG. 6.

The emitter area ratio between the current dividing Trs 18 and 19 and the output side Tr 4 and non-output side Tr 5 is equal to the ratio between the input current to the current dividing circuit 17 and the input current to the current-dividing differential transistor couple at the upper stage of the circuit of FIG. 1. Further, since the current dividing Trs 18 and 19 are provided, between the bases thereof, with the same potential difference as the potential difference between the bases of the output side Tr 4 and non-output side Tr 5, the current dividing Trs 18 and 19 determine the ratio of currents to the negative feedback paths F1 and F2 according to the gain. As a result, while the current consumed in the circuit of FIG. 10 increases by an amount corresponding to that flows through the non-output side negative feedback paths F2a and F2b, the current consumed in the circuit of FIG. 1 does not increase compared with a circuit based on the conventional art 1 which corresponds to a single-ended input/output type modification of the circuit shown in FIG. 6, since an amount of current which is approximately equal to the current that flows in a negative feedback path in the circuit of FIG. 6 is divided between the negative feedback paths in the circuit of FIG. 1 in a ratio that is determined by the gain, and a favorable matching characteristic and an almost constant distortion characteristic can be achieved.

Figure 10:
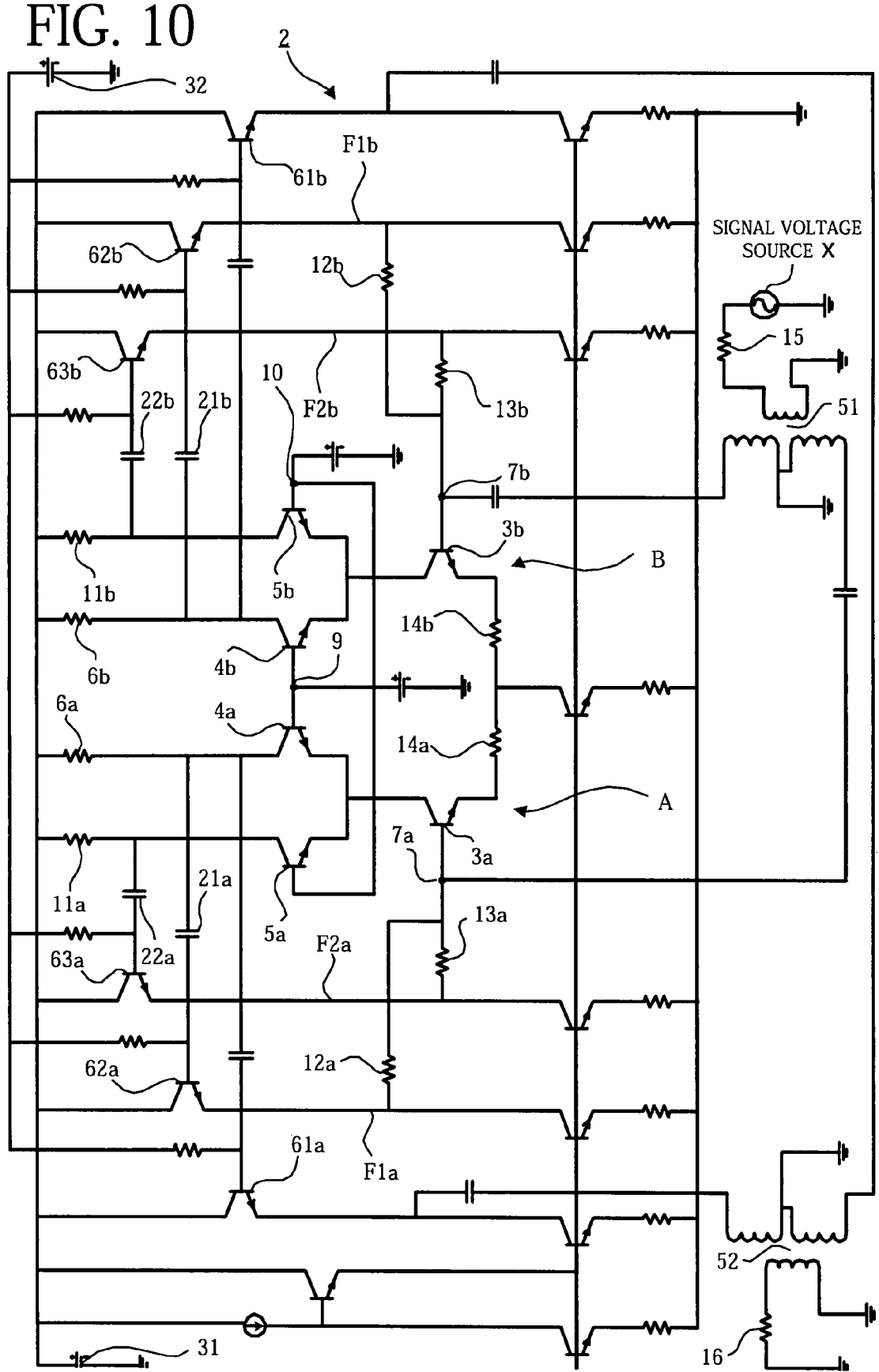
FIG. 10 is a simulation circuit diagram of a variable gain differential amplifier, in which a load and a negative feedback path are provided for a gain control transistor at a non-output side.

Further, the current consumed is smaller and the noise figure at the maximum gain is smaller in the variable gain amplifier I of the present invention, than in a circuit which corresponds to a single-ended input/output type modification of the circuit of FIG. 10 in which a negative feedback path is provided for the load resistor at the non-output side. The circuit of FIG. 10, in which constant operating currents are always flowing in the Tr 63a and Tr 63b in the two negative feedback paths F2a and F2b, produces more noise, which amounts to one emitter follower (two emitter followers in the case of a differential amplifier), than the circuit of FIG. 6 based on the conventional art 1. As compared with this, the circuit of FIG. 1, in which the operating current in the Tr 63 is zeroed at the maximum gain since it is unnecessary, has a smaller increase in the noise than the circuit of FIG. 10.

Further, the circuit of FIG. 1 can function, if only the same potential difference as that between the $V_{agc+}$ terminal 9 and the $V_{agc-}$ terminal 10 was provided between the bases of the current dividing Trs 18 and 19. Therefore, only by making minor changes to the gain control circuit which is designed to control the gain of the variable gain amplifier circuits such as shown in FIG. 6 and in FIG. 10, it is possible to control the circuit of the present embodiment 1. Accordingly, almost no increase occurs in the die area and the current consumed, which are required by the gain control circuit.

Embodiment 2

Figure 2:
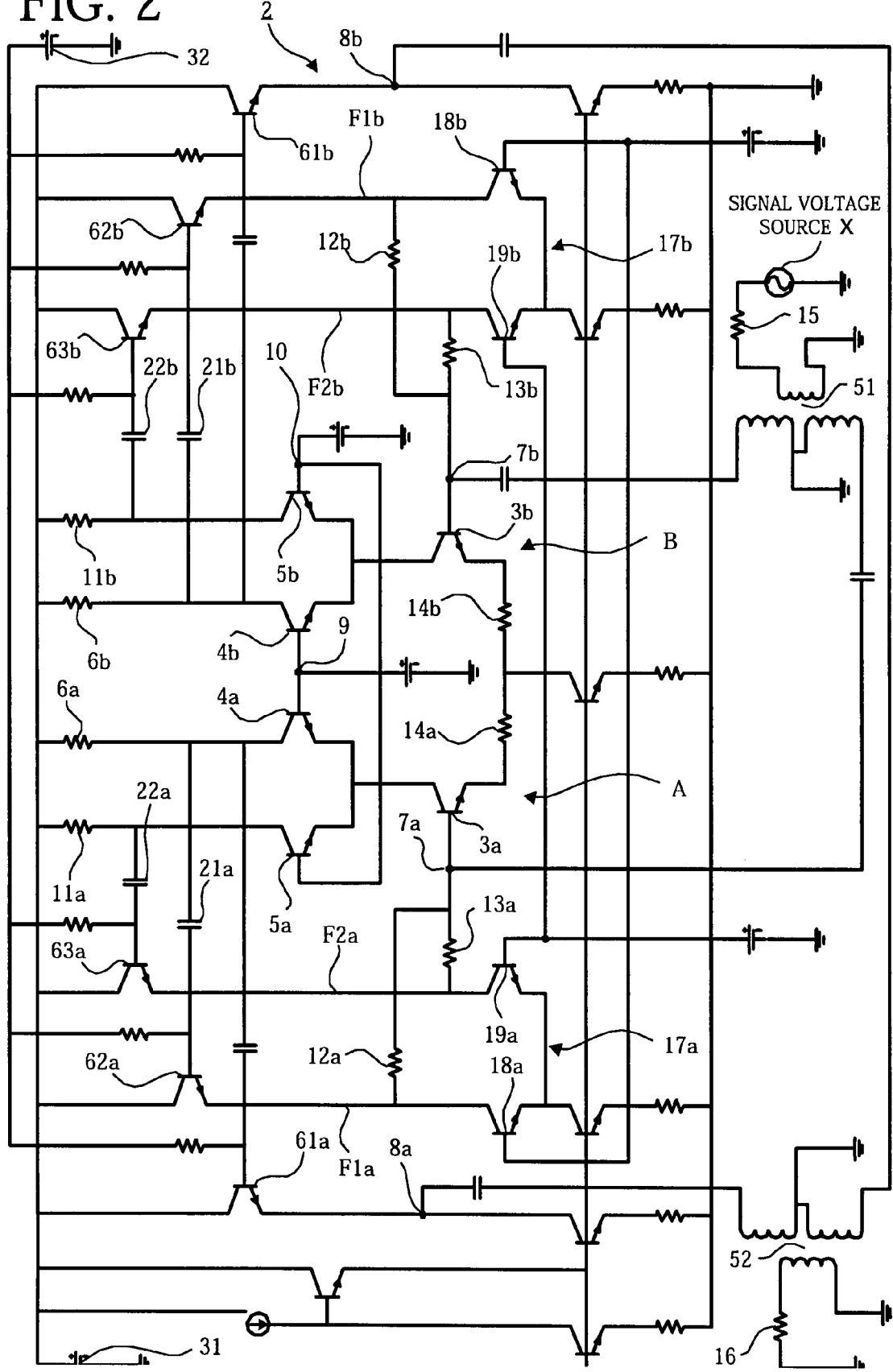
FIG. 2 is a circuit diagram showing a differential amplifier as one embodiment of the present invention.

Next, one embodiment of a differential amplifier, in which variable gain amplifying circuits according to the present embodiment are used, will be explained. FIG. 2 is a circuit diagram showing the circuit of a differential amplifier 2 as one embodiment of the present invention.

According to the embodiment 2, the differential amplifier 2 comprises a variable gain amplifying circuit A for amplifying a positive phase signal, and a variable gain amplifying circuit B for differentially amplifying an antiphase signal, as shown in FIG. 2. The variable gain amplifying circuit A comprises a signal amplifying transistor 3a, an output load 6a, an output terminal 8a, an output side Tr 4a, a non-output side Tr 5a, an input terminal 7a, and an non-output load 11a. The variable gain amplifying circuit B comprises a signal amplifying transistor 3b, an output load 6b, an output terminal 8b, an output side Tr 4b, a non-output side Tr 5b, an input terminal 7b, and a non-output load 11b. The signal amplifying transistors 3a and 3b, the output loads 6a and 6b, the output terminals 8a and 8b, the output side Trs 4a and 4b, the non-output side Trs 5a and 5b, the input terminals 7a and 7b, and the non-output loads 11a and 11b are formed symmetrically. The differential amplifier 2 amplifies a positive phase signal by the variable gain amplifying circuit A at the left-hand side of FIG. 2, and amplifies an antiphase signal by the variable gain amplifying circuit B at the right-hand side.

In the differential amplifier 2 shown in FIG. 2, the signal amplifying transistors (hereinafter referred to as signal amplifying Trs) 3a and 3b have their bases connected to the input terminals 7a and 7b, and have their emitters connected to a current source via emitter degeneration resistors. The collectors of the signal amplifying Trs 3a and 3b are connected to the emitters of the output side gain control transistors 4a and 4b respectively, and to the emitters of the non-output side gain control transistors 5a and 5b respectively.

The collectors of the output side gain control transistors (hereinafter referred to as output side Trs) 4a and 4b are connected to a voltage source 31 via the output loads 6a and 6b. The collectors of the output side Trs 4a and 4b are connected to the output terminals 8a and 8b via emitter followers using transistors 61a and 61b. Further, the collectors of the output side Trs 4a and 4b are connected to the input terminals 7a and 7b via transistors 62a and 62b using emitter followers, through negative feedback paths F1a and F1b in which capacitors 21a and 21b and resistors 12a and 12b are connected in series.

On the other hand, the collectors of the non-output side gain control transistors (hereinafter referred to as non-output side Trs) 5a and 5b are connected to the voltage source 31, via the non-output loads 11a and 11b, which have the same resistance as the output loads 6a and 6b. Likewise the output side Trs 4a and 4b, the collectors of the non-output side Trs 5a and 5b are connected to the input terminal 7a and 7b, via emitter followers using transistors 63a and 63b, through negative feedback paths F2a and F2b in which capacitors 22a and 22b and resistors 13a and 13b are connected in series.

By forming the negative feedback paths F1a, F1b, F2a, and F2b with emitter followers, it is possible to make the influence from the input to the output through feedback paths small, and reduce coupling between the collector of the output side gain control transistor 4a(Tr 4a) and the collector of the non-output side gain control transistor 5a(Tr 5a), and also equally coupling between the collectors of Trs 4b and 5b at the right-hand side, via feedback paths. Further, it is possible to achieve a large gain variable width.

Furthermore, biasing currents for the emitter followers are supplied from another external circuit than the output current. That is, the base biasing currents of the transistors 61a, 61b, 62a, 62b, 63a, and 63b, which constitute the emitter followers, are taken from another voltage source 32 through biasing resisitors than from output collector currents of the output side and the non-output side gain control Trs 4a, 4b, 5a, and 5b.

The bases of the output side Trs 4a and 4b and the bases of the non-output side Trs 5a and 5b are connected respectively to a $V_{agc+}$ terminal 9 and a $V_{agc-}$ terminal 10, to which gain control voltages $V_{agc+}$ and $V_{agc-}$ are input respectively.

The circuit of FIG. 2 further comprises a current dividing circuit 17a, which comprises a current dividing transistor 18a and a current dividing transistor 19a (hereinafter referred to as current dividing Tr 18a and current dividing Tr 19a). Furthermore, the circuit of FIG. 2 comprises a current dividing circuit 17b, which comprises a current dividing transistor 18b and a current dividing transistor 19b (hereinafter referred to as current dividing Tr 18b and current dividing Tr 19b). The current dividing Tr 18a (18b) and the current dividing Tr 19a (19b) form a differential transistor couple of the same type as the current-dividing differential transistor couple at the upper stage of the circuit of FIG. 1, i.e., the couple of the output side Tr 4a (4b) and the non-output side Tr 5a (5b).

The outputs of the current dividing circuits 17a and 17b are connected respectively to the negative feedback paths F1a and F2a and the negative feedback paths F1b and F2b, which comprise the emitter followers.

Likewise in the embodiment 1, the negative feedback paths F1a and F1b from the collectors of the output side Trs 4a and 4b have the same structure as the negative feedback paths F2a and F2b from the collectors of the non-output side Trs 5a and 5b. When the DC base voltage of the output side Trs 4a and 4b is $V_{bias+}V_{agc}$, and the DC base voltage of the non-output side Trs 5a and 5b is $V_{bias}-V_{agc}$, (here, $V_{bias}$ refers to some fixed DC voltage), while the gain of the amplifier changes as the value of $V_{agc}$ changes, the sum of each of the voltage amplitude of inverting amplified signals which appear at the base terminals of the output side emitter follower Tr 62a and the non-output side emitter follower Tr 63a, or equally at the bases of Trs 62b and 63b in FIG. 2 remains unchanged, keeping the total of the amounts of negative feedback almost constant, irrespective of the gain. Accordingly, an almost constant input reflection characteristic can be achieved regardless of the gain and a favorable input matching characteristic can be achieved over a wide frequency range regardless of the gain. Further, an almost constant distortion characteristic can be achieved regardless of the gain.

The emitter area ratio between the current dividing Tr 19a and Tr 4a is equal to the ratio between the input current to the current dividing circuit 17a and the input current to the gain control transistor pair which comprises Tr 4a and Tr 5a. By symmetry, the same design rule holds in the right-hand side variable gain amplifier in FIG. 2, i.e., the emitter area ratio between the current dividing Tr 19b and Tr 4b is equal to the ratio between the input current to the current dividing circuit 17b and the input current to the gain control transistor pair which comprises Tr 4b and Tr 5b. Note that the left-hand side Tr and the right-hand side Tr in a differential transistor pair in FIG. 2, namely Tr 18a and Tr 19a, Tr 4a and Tr 5a, Tr 4b and Tr 5b, and Tr 18b and Tr 19b, have the same emitter area size. Further, the current dividing Trs 18a and 19a are provided, between the bases thereof, with the same DC voltage potential difference as the DC voltage potential difference applied between the bases of Tr 4a and Tr 5a, i.e., the DC voltage potential difference between the $V_{agc+}$ terminal 9 and the $V_{agc-}$ terminal 10. Due to its balanced structure as shown in FIG. 2, the same DC voltage potential difference is also applied between the bases of Tr 4b and Tr 5b, as well as between the bases of the current dividing Trs 18b and 19b. Accordingly, based on a similar principle to that of the case of FIG. 1 explained earlier, the current dividing circuit 17a distributes currents to the negative feedback paths F1a and F2a according to the gain, at the same ratio of currents as the ratio of the operating currents in the Tr 4a and Tr 5a. Equally, as the circuit in FIG. 2 has a balanced structure, the current dividing circuit 17b distributes currents to the negative feedback paths F1b and F2b according to the gain, at the same ratio of currents as the ratio of the operating currents in the Tr 4b and Tr 5b. As a result, by distributing currents to the negative feedback paths according to the gain, the circuit of FIG. 2 can cause the negative feedback paths to function, with a current amounting to one negative feedback path of FIG. 10. Accordingly, a favorable matching characteristic and an almost constant distortion characteristic can be achieved regardless of the gain, with no increase in the current consumption comparing with that of a circuit based on the conventional art 1 such as shown in FIG. 6.

Further, the current consumed is smaller and the noise figure at the maximum gain is smaller in the differential amplifier 2 of the present invention, than in the circuit of FIG. 10 in which a negative feedback path is provided for the transistor at the non-output side. The circuit of FIG. 10, in which constant operating currents are always flowing in the Tr 63a and Tr 63b in the two negative feedback paths F2a and F2b, produces more noise, which amounts to two emitter followers, than the circuit of FIG. 6 based on the conventional art 1. As compared with this, the circuit of FIG. 2, in which the operating currents in the Trs 63a and 63b are reduced at the maximum gain since they are unnecessary, has a smaller increase in the noise than the circuit of FIG. 10.

Further, the circuit of FIG. 2 can function, if only the same potential difference as that between the $V_{agc+}$ terminal 9 and the $V_{agc-}$ terminal 10 is provided between the bases of the current dividing Trs 18a and 19a, and also between the bases of the current dividing Trs 18b and 19b. Therefore, only by making minor changes to the gain control circuit which is designed to control the gain of the variable gain amplifier circuits such as shown in FIG. 6 and in FIG. 10, it is possible to control the circuit of the present embodiment 2. Accordingly, almost no increase occurs in the die area and the current consumed, which are required by the gain control circuit for the differential amplifier 2 in FIG. 2, compared with a conventional gain control circuit, such as designed for the circuits of FIG. 6 and FIG. 10.

According to the embodiment 2, a single-phase input signal from an input signal source, which comprises a signal voltage source X and an input signal source impedance 15 shown in FIG. 2, is transformed by a transformer 51 into a balance signal and applied to the bases of the signal amplifying Trs 3a and 3b. And outputs are acquired from the collectors of the output side Trs 4a and 4b by the emitter followers using the transistors 61a and 61b, and the differential signal of the acquired outputs is transformed by a transformer 52 into a single-phase signal and applied to an output load impedance 16.

According to the conventional art 2 described above, when the output load resistances AM+BM as well as AP+BP in FIG. 8 are reduced, the resistances of the negative feedback signal outputting resistors BP and BM also reduce proportionally, making it difficult to secure negative feedback of a sufficient amount. When reversely the output load resistances AM+BM as well as AP+BP in FIG. 8 are increased in order to secure negative feedback of a sufficient amount, the influence of the so-called Miller effect becomes large and this worsens the negative feedback characteristic particularly in the high frequency ranges. As compared with this, the differential amplifier 2 of the present embodiment 2 can achieve negative feedback of a sufficient amount even in the case where the output loads 6a and 6b and non-output loads 11a and 11b, which have a relatively low resistance, are used. Therefore, the negative feedback characteristic is less likely to worsen even in the high frequency ranges.

Further, according to the embodiment 2, a gain variable width of about 40 dB can be realized over a wide frequency range. In a case where the gain variable width is set to 40 dB in the conventional art 2 described above, the resistance of the resistors BM and equally BP in FIG. 8 becomes a small value, which is 1% of the output load resistances AM+BM and AP+BP. It is difficult to achieve sufficient distortion characteristic and input matching characteristic with the use of the resistors BM and BP having such a small negative feedback signal output, and also the noise figure characteristic becomes poorer. As compared with this, according to the present embodiment 2, a gain variable width of about 40 dB, and favorable input matching characteristic and noise figure characteristic over a wide frequency range can be realized simultaneously.

Embodiment 3

Figure 4:
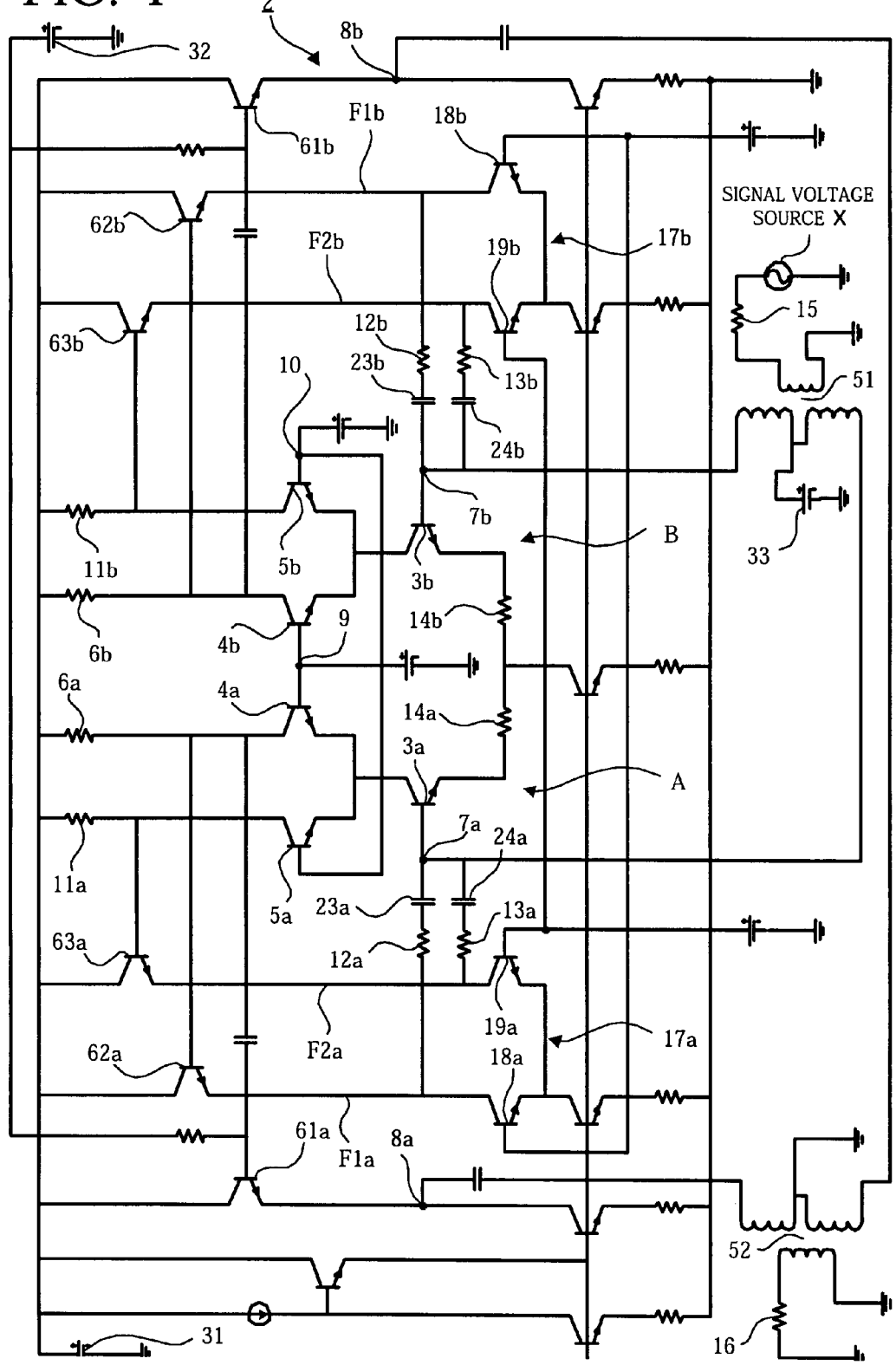
FIG. 4 is a circuit diagram showing a modified example of the differential amplifier as one embodiment of the present invention.

FIG. 4 is a circuit diagram showing a modified example of the differential amplifier as one embodiment of the present invention. In addition to the elements of the circuit of FIG. 2, the differential amplifier 2 of FIG. 4 further comprises capacitors 23a and 24a between the negative feedback resistors 12a and 13a and the base of the signal amplifying Tr 3a (input terminal 7a), thereby to shut off direct currents. In its right-hand side symmetrically, the differential amplifier 2 of FIG. 4 also comprises capacitors 23b and 24b between the negative feedback resistors 12b and 13b and the base of the signal amplifying Tr 3b (input terminal 7b). Along with this, base biasing currents for the signal amplifying Trs 3a and 3b are supplied from an external power source 33.

Generally, in making differential amplifiers that have nearly the same performances in the same frequency range based on the circuits of FIG. 2 and FIG. 4, it is possible to set the capacitance of the capacitors 21a, 22a, 21b, and 22b in the negative feedback paths in the circuit of FIG. 2 smaller than that of the capacitors 23a, 24a, 23b, and 24b in the negative feedback paths in the circuit of FIG. 4. Accordingly, the circuit of FIG. 2 is more advantageous in regard to die size when it is realized as an integrated circuit, and also suffers less from the performance degradation caused by parasitic capacitance of capacitors in the negative feedback paths. However, the circuit of FIG. 2 has the following problem.

In the circuit of the embodiment 2, the base biasing current for the signal amplifying Tr 3a or 3b of the differential amplifier is supplied from the operating currents of the emitter followers (Trs) 62a and 63a or 62b and 63b in the negative feedback paths. This base biasing current is consumed constantly regardless of the gain, and this constant consumption forms a factor of errors with respect to the ratio of operating currents distributed by the current dividing circuit 17a or 17b to the emitter followers (Trs) 62a and 63a or 62b and 63b. Further, when the current dividing circuit 17a or 17b changes the operating currents to be distributed to the emitter followers (Trs) 62a and 63a or 62b and 63b, the base-emitter voltages of the Trs 62a and 63a or 62b and 63b change accordingly, thereby producing a potential difference across the series resistance that comprises the negative feedback resistors 12a and 13a or across the series resistance that comprises the negative feedback resistors 12b and 13b. The current caused, by this potential difference, to flow across the negative feedback resistors 12a and 13a or across the negative feedback resistors 12b and 13b also forms a factor of errors with respect to the ratio of operating currents distributed by the current dividing circuit 17a or 17b to the emitter followers (Trs) 62a and 63a or 62b and 63b.

With the presence of such operating currents, some operating current flows in the emitter follower (Tr) 63a or 63b in the non-output side negative feedback path even when the gain is the maximum. Because of this, the NF characteristic at the maximum gain becomes poorer than that of the circuit (FIG. 6) of the conventional art 1 which has no non-output side negative feedback path, due to the noise produced from the operating current flowing in the non-output side negative feedback path.

As compared with the above, the circuit of FIG. 4 according to the embodiment 3 has the capacitors 23a and 24a or 23b and 24b shut off any direct current between the negative feedback paths and the input terminal 7a or 7b to allow occurrence of no error current. This enables operating currents to be supplied to the emitter followers (Trs) 62a and 63a or 62b and 63b at the very division ratio determined by the current dividing circuit 17a or 17b. Therefore, when the gain is the maximum, the circuit of FIG. 4 has almost no operating current flowing in the emitter follower (Tr) 63a or 63b in the non-output side negative feedback path, achieving almost the same NF at the maximum gain as that of the circuit (FIG. 6) of the conventional art 1 which has no non-output side negative feedback path.

Next, the results of operation simulations actually performed on the circuits of the embodiments 2 and 3 will be explained. In the simulations on the embodiments 2 and 3, the same transistors, the same input signal source impedance, the same output load impedance, the same operating currents, and the same temperature as those used in the simulations on the circuit of FIG. 6 shown in FIGS. 7A to 7D were used. Therefore, the performances can be compared under equal conditions to the simulation results shown in FIGS. 7A to 7D.

EXAMPLE 1

Operation simulations were conducted on the balanced-input/output variable gain differential amplifier (FIG. 2) of the embodiments, by changing the gain control voltage. FIGS. 3A to 3D are graphs respectively plotting input transmission characteristic (S21) of the S parameter, noise figure (NF), input reflection characteristic (S11) of the S parameter, and third order input intercept point (IIP3) indicating intermodulation distortion characteristic, which were observed when the input signal was 50 MHz, 300 MHz, and 550 MHz. The X axis of each graph denoted as $V_{agc}$ represents, by the unit of volt, a half of the DC voltage across two base terminals 9 and 10 of gain control transistor pairs that comprise the output side Tr 4a and the non-output side Tr 5a at the left-hand side of the circuit in FIG. 2, and the output side Tr 4b and the non-output side Tr 5b at the right-hand side respectively.

Figure 3A:
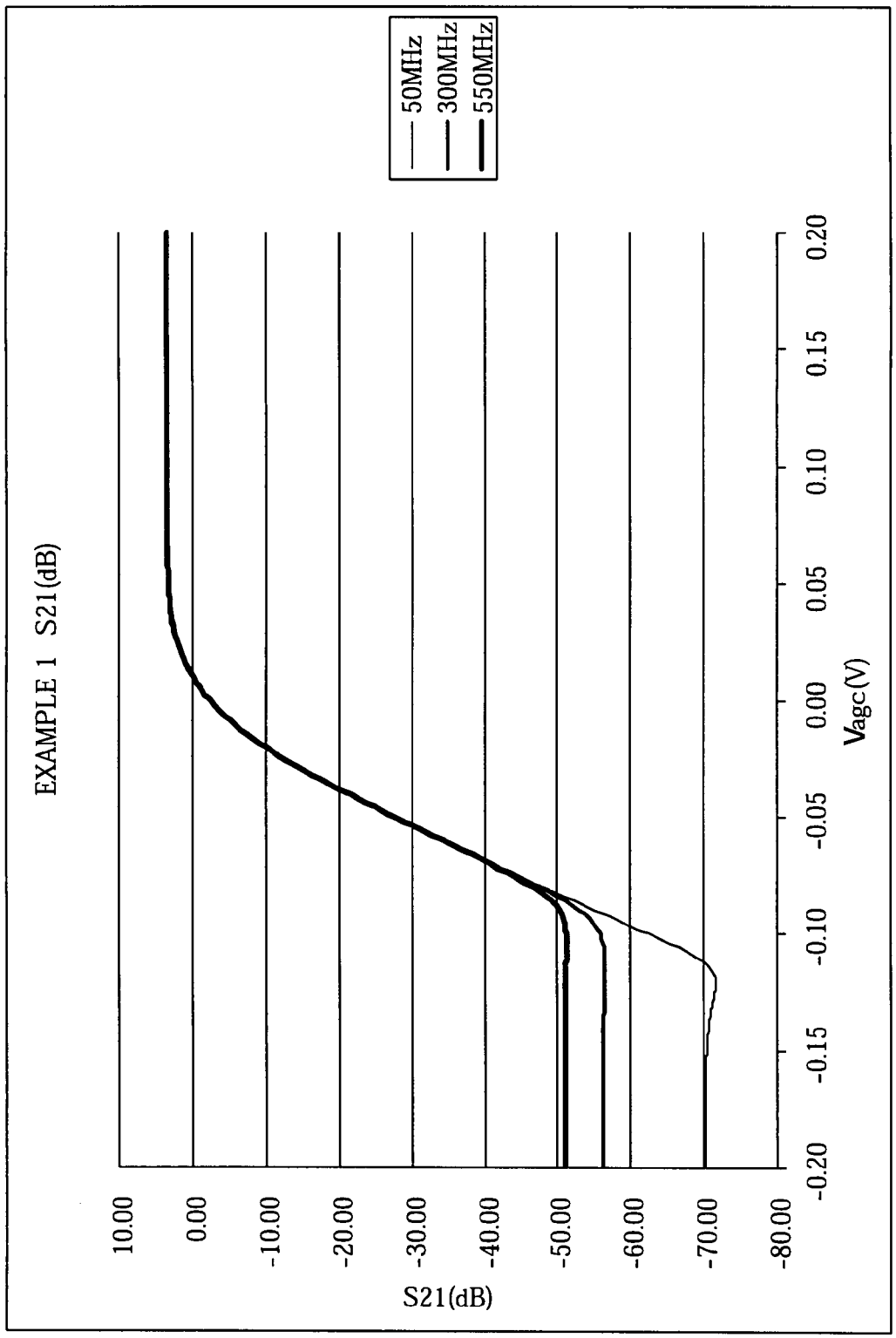
FIG. 3A is a graph plotting input transmission characteristic S21 of the S parameter, in a case where the gain control voltage is changed in the differential amplifier of FIG. 2.
Figure 3B:
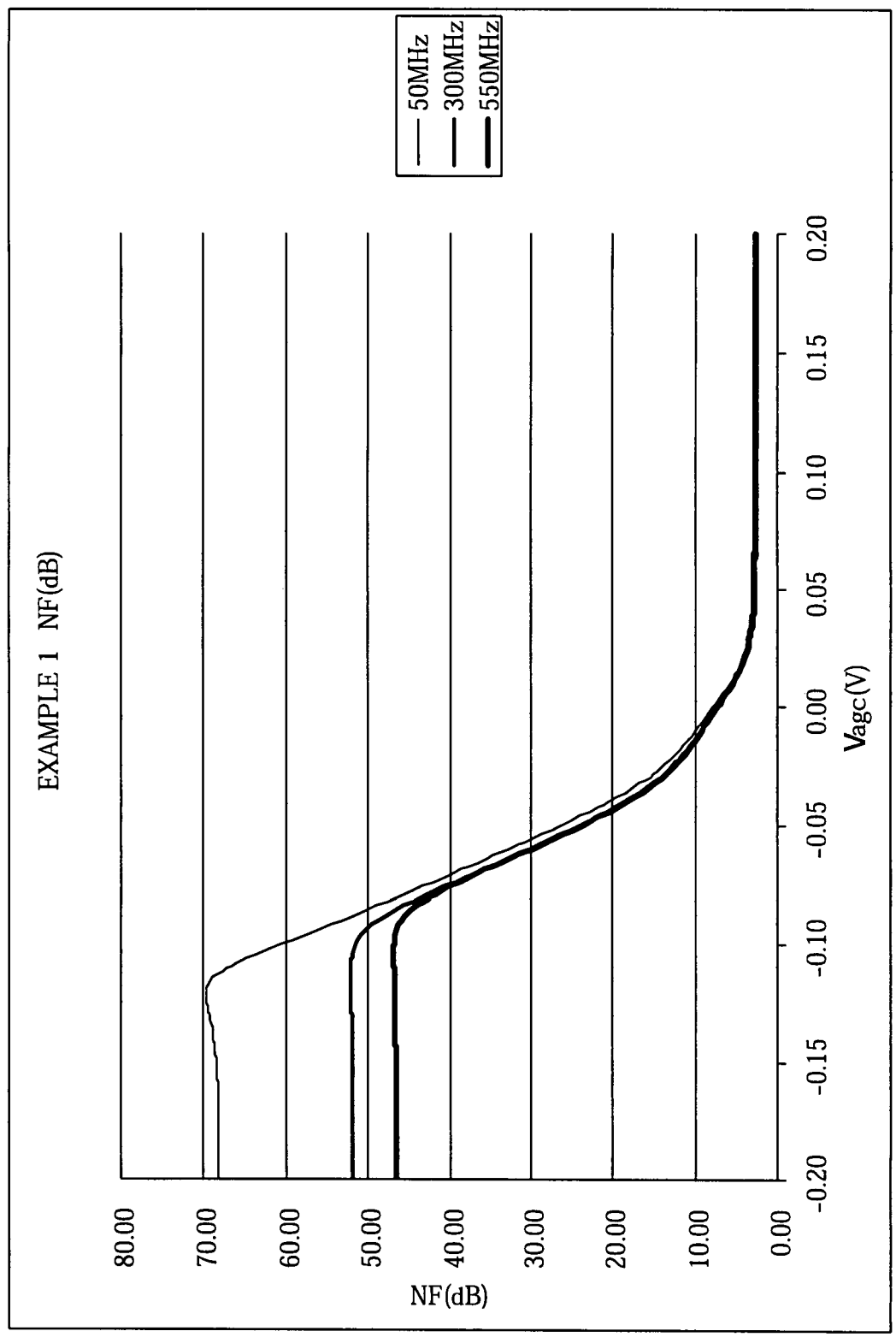
FIG. 3B is a graph plotting noise figure NF, in a case where the gain control voltage is changed in the differential amplifier of FIG. 2.
Figure 3C:
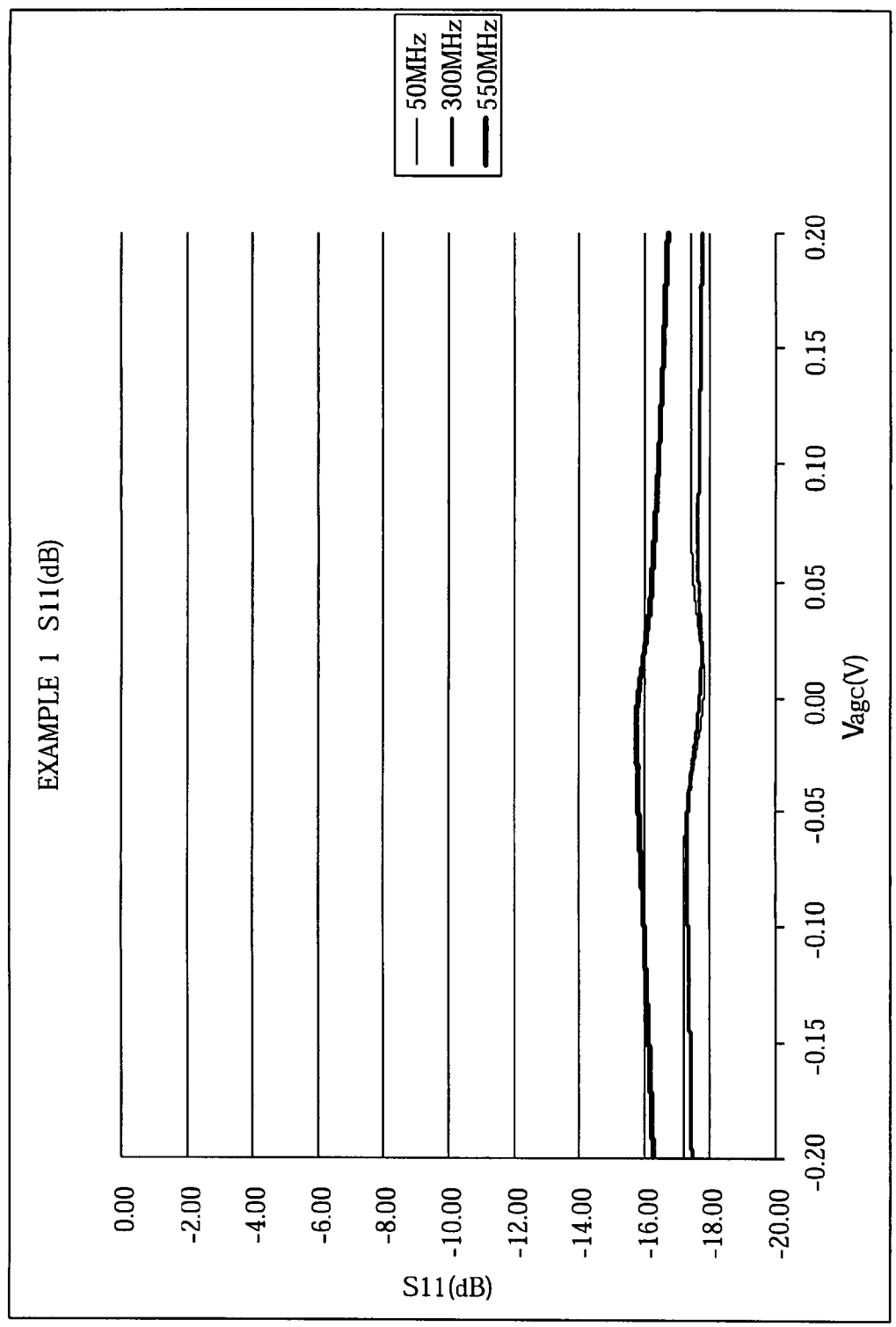
FIG. 3C is a graph plotting input reflection characteristic S11 of the S parameter, in a case where the gain control voltage is changed in the differential amplifier of FIG. 2.
Figure 3D:
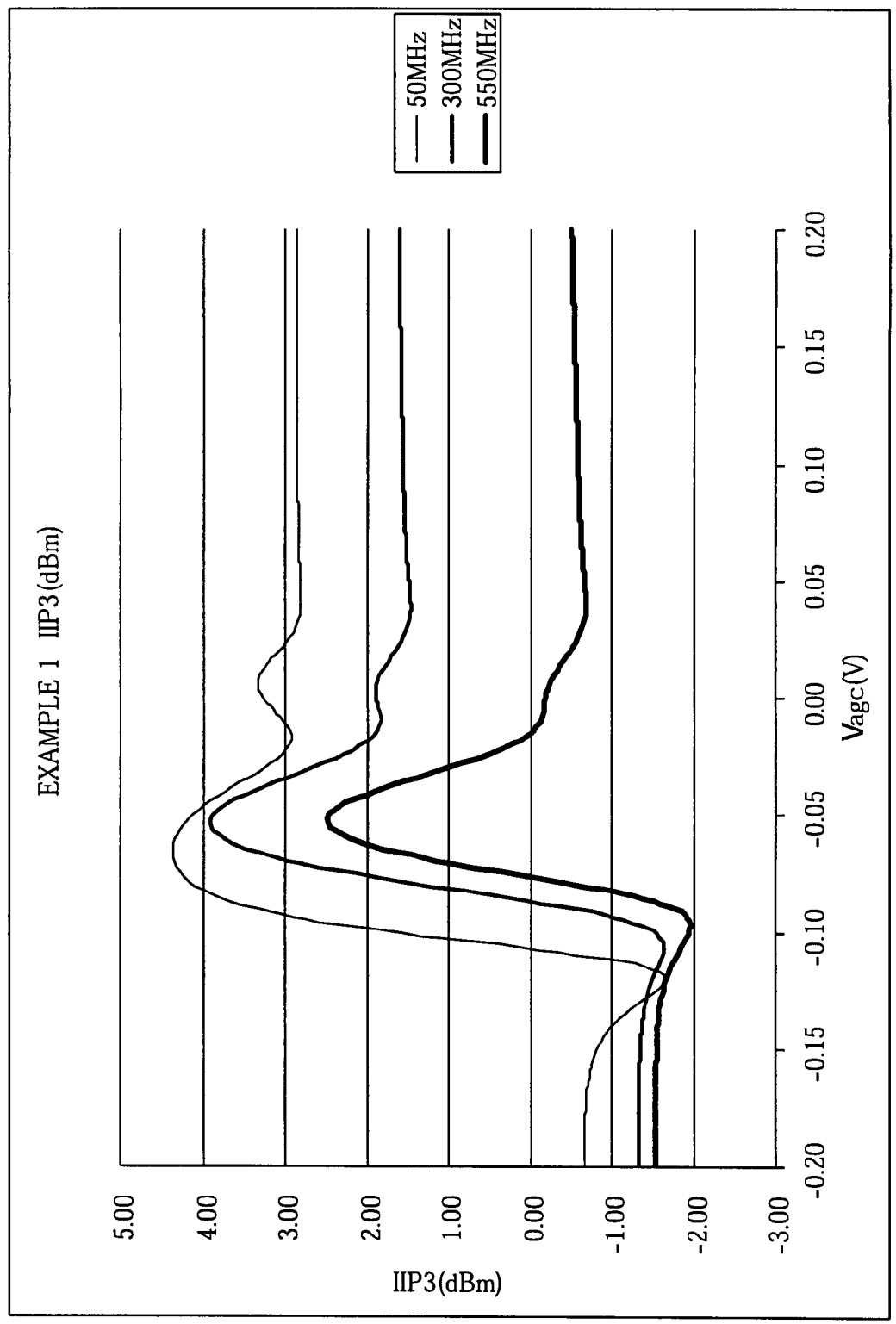
FIG. 3D is a graph plotting third order input intercept point IIP3, in a case where the gain control voltage is changed in the differential amplifier of FIG. 2.

How the gain changed when $V_{agc}$ was changed is represented by the graph of S21 shown in FIG. 3A. IIP3 was observed by conducting the simulations by inputting, at −50 dBm, two tone signals having center frequencies which were apart from the nominal measurement frequency by ±10 kHz. The transition frequency $f_T$ of the transistor models used in the simulations was 8 GHz. In FIGS. 3A to 3D, the bold line plots the simulation results at 550 MHz, the mid-size line plots at 300 MHz, and the thin line plots at 50 MHz, respectively.

Figure 11A:
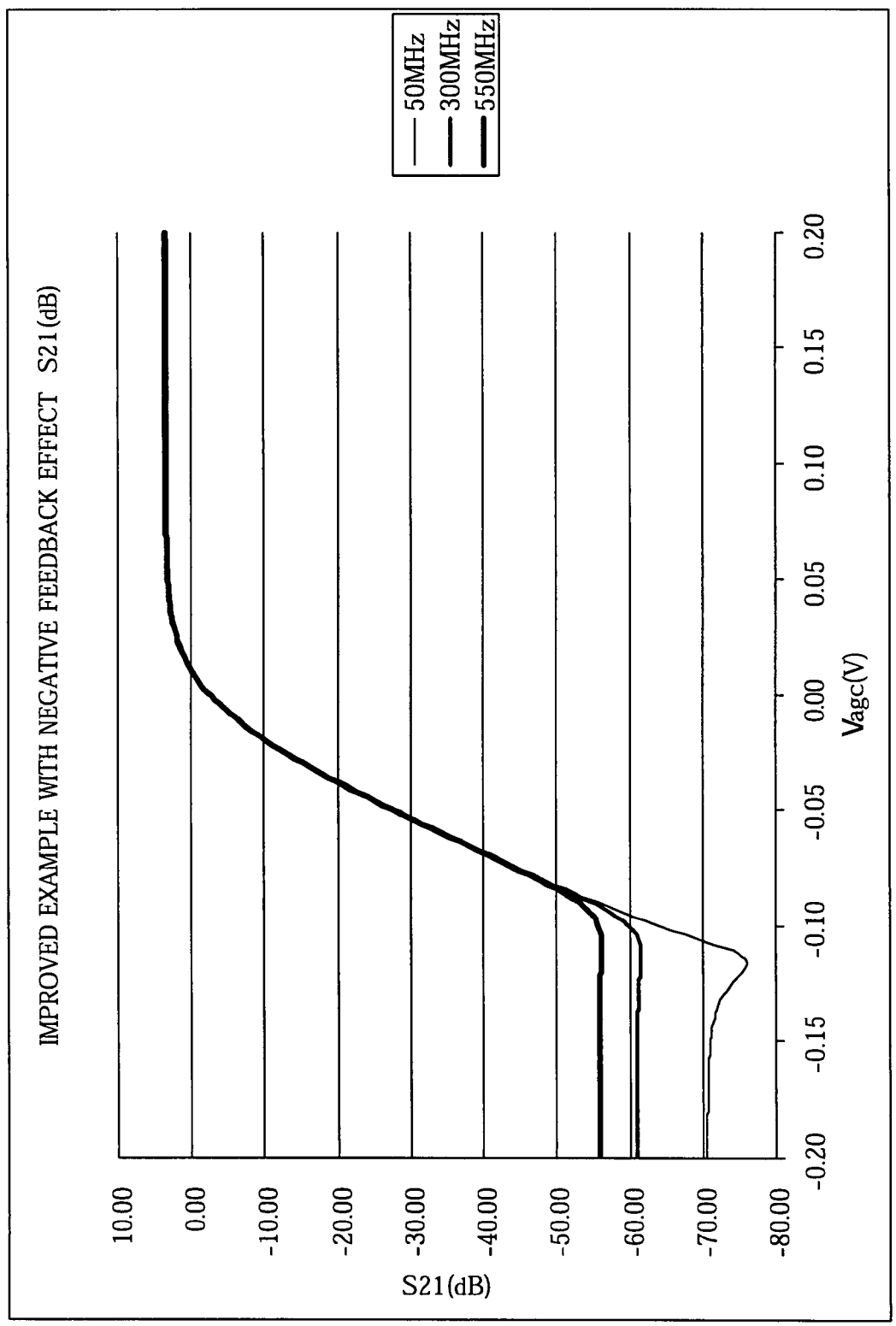
FIG. 11A is a graph plotting input transmission characteristic S21 of the S parameter, in a case where the gain control voltage is changed in the differential amplifier of FIG. 10.
Figure 11B:
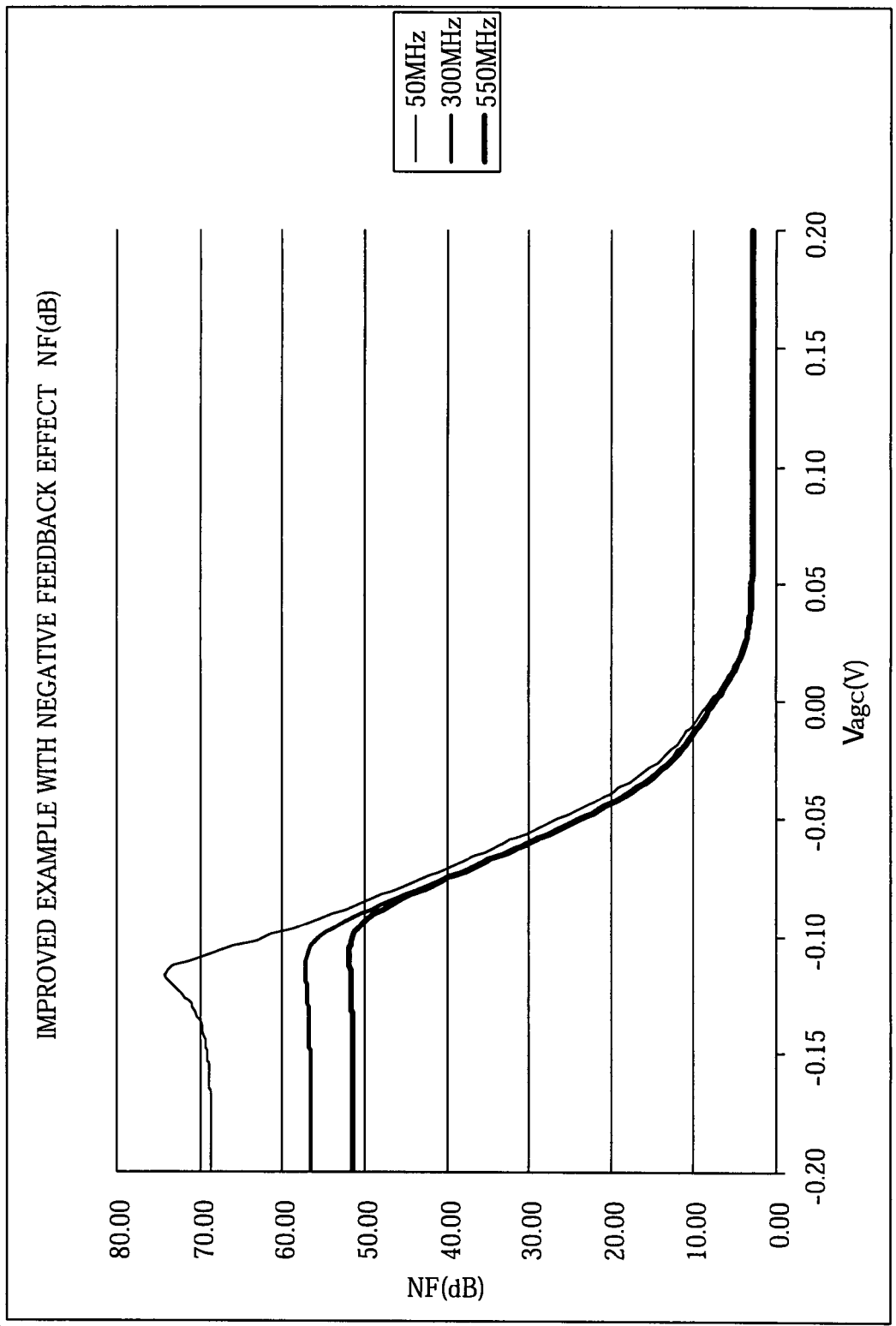
FIG. 11B is a graph plotting noise figure NF, in a case where the gain control voltage is changed in the differential amplifier of FIG. 10.
Figure 11C:
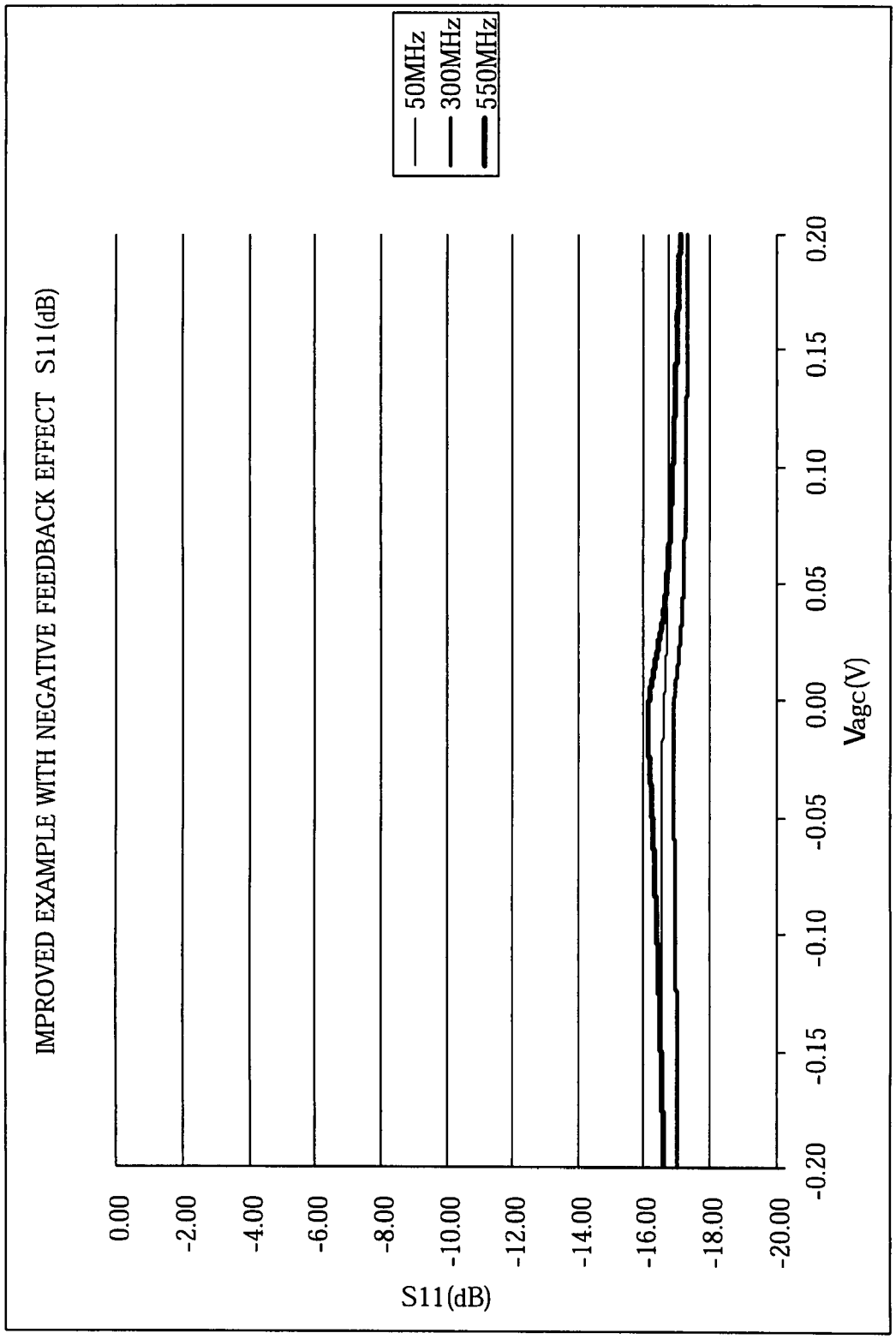
FIG. 11C is a graph plotting input reflection characteristic S11 of the S parameter, in a case where the gain control voltage is changed in the differential amplifier of FIG. 10.
Figure 11D:
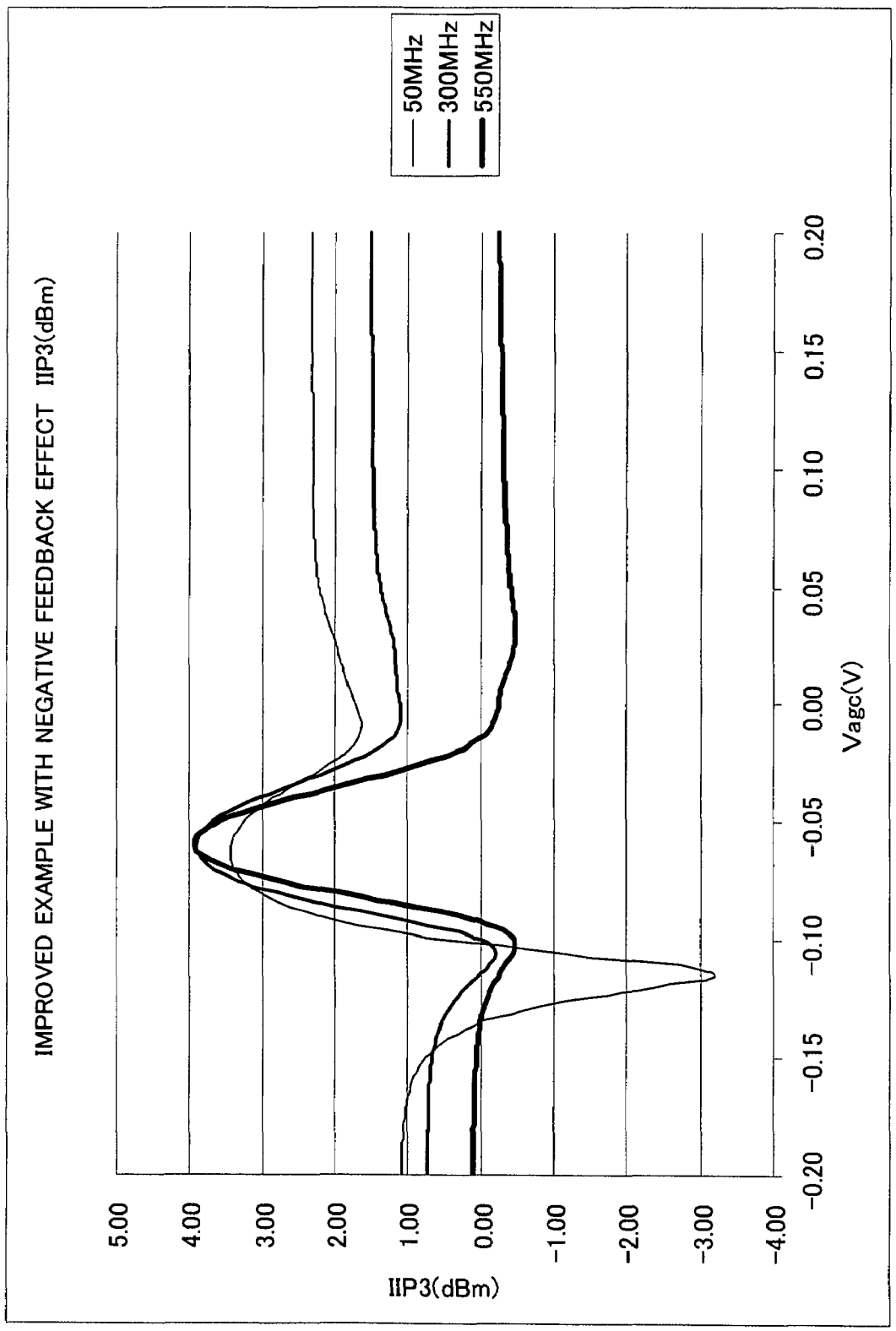
FIG. 11D is a graph plotting third order input intercept point IIP3, in a case where the gain control voltage is changed in the differential amplifier of FIG. 10.

The gain variable widths were almost equal to the simulation results (FIG. 11A) of the circuit of FIG. 10, and the distortion characteristic and the input reflection characteristic took almost equal values to the results of FIG. 11D and FIG. 11C in the gain variable widths of about 50 to 60 dB. The NF at the maximum gain was smaller than the results of FIG. 11B by about 0.2 dB. The current consumed was smaller than that consumed by the circuit of FIG. 10, by an amount corresponding to two negative feedback paths (0.6 mA×2). The current consumed by the amplifier itself was 9.6 mA, which was equal to the circuit of FIG. 10. It can be understood that the embodiment 2 can realize a wide band variable gain differential amplifier which has the above-described advantages, without increasing the current consumed.

EXAMPLE 2

Operation simulations were conducted on the balanced-input/output variable gain differential amplifier (FIG. 4), by changing the gain control voltage. FIGS. 5A to 5D are graphs respectively plotting input transmission characteristic (S21) of the S parameter, noise figure (NF), input reflection characteristic (S11) of the S parameter, and third order input intercept point (IIP3) indicating intermodulation distortion characteristic, which were observed when the input signal was 50 MHz, 300 MHz, and 550 MHz. The X axis of each graph denoted as $V_{agc}$ represents, by the unit of volt, a half of the DC voltage across the $V_{agc+}$ terminal 9 and the $V_{agc−}$ terminal 10, namely the voltage across the bases of gain control transistor pairs that comprise the output side Tr 4a and the non-output side Tr 5a at the left-hand side of the circuit in FIG. 4, and the output side Tr 4b and the non-output side Tr 5b at the right-hand side respectively.

Figure 5A:
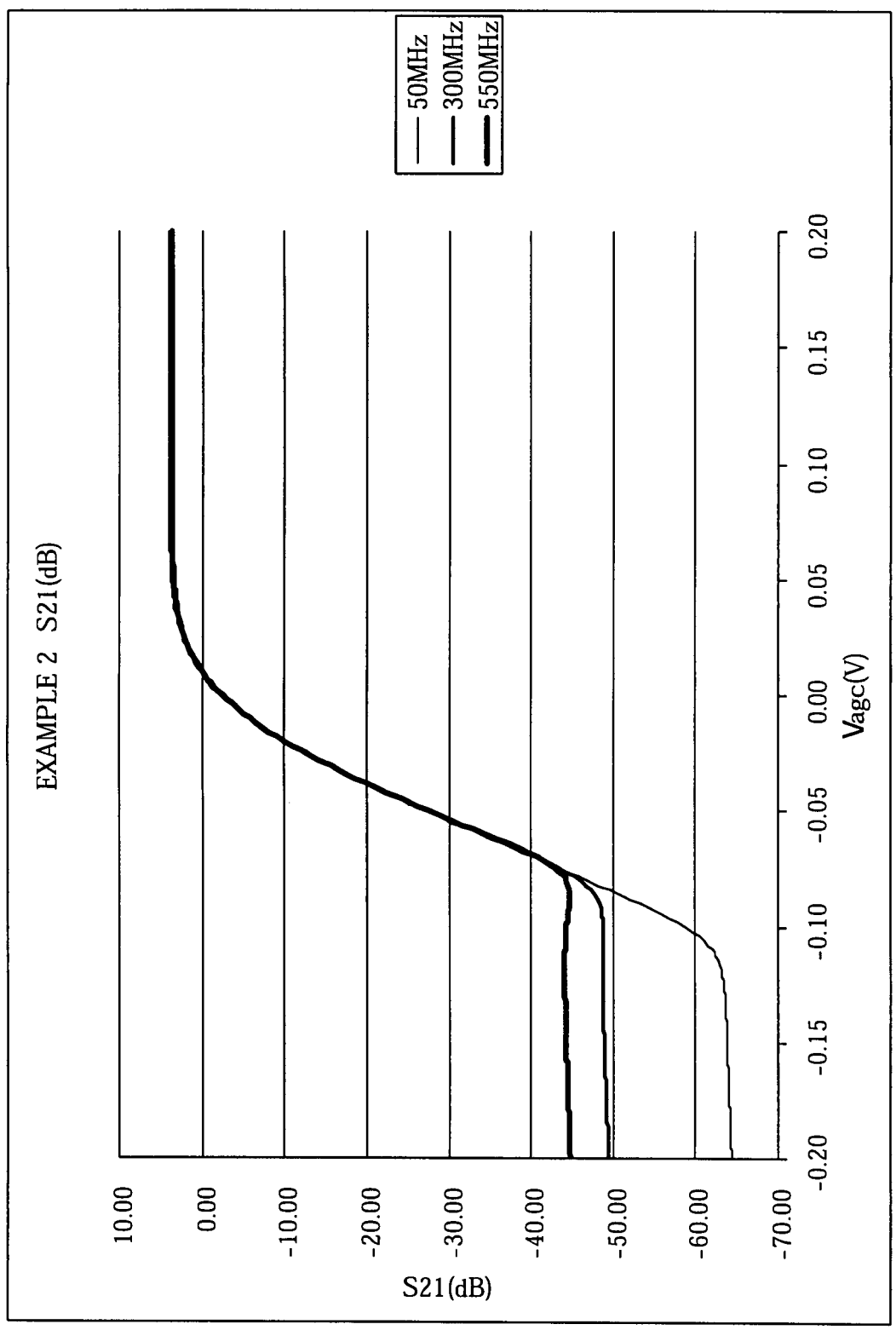
FIG. 5A is a graph plotting the input transmission characteristic S21 of the S parameter, in a case where the gain control voltage is changed in the differential amplifier of FIG.4.
Figure 5B:
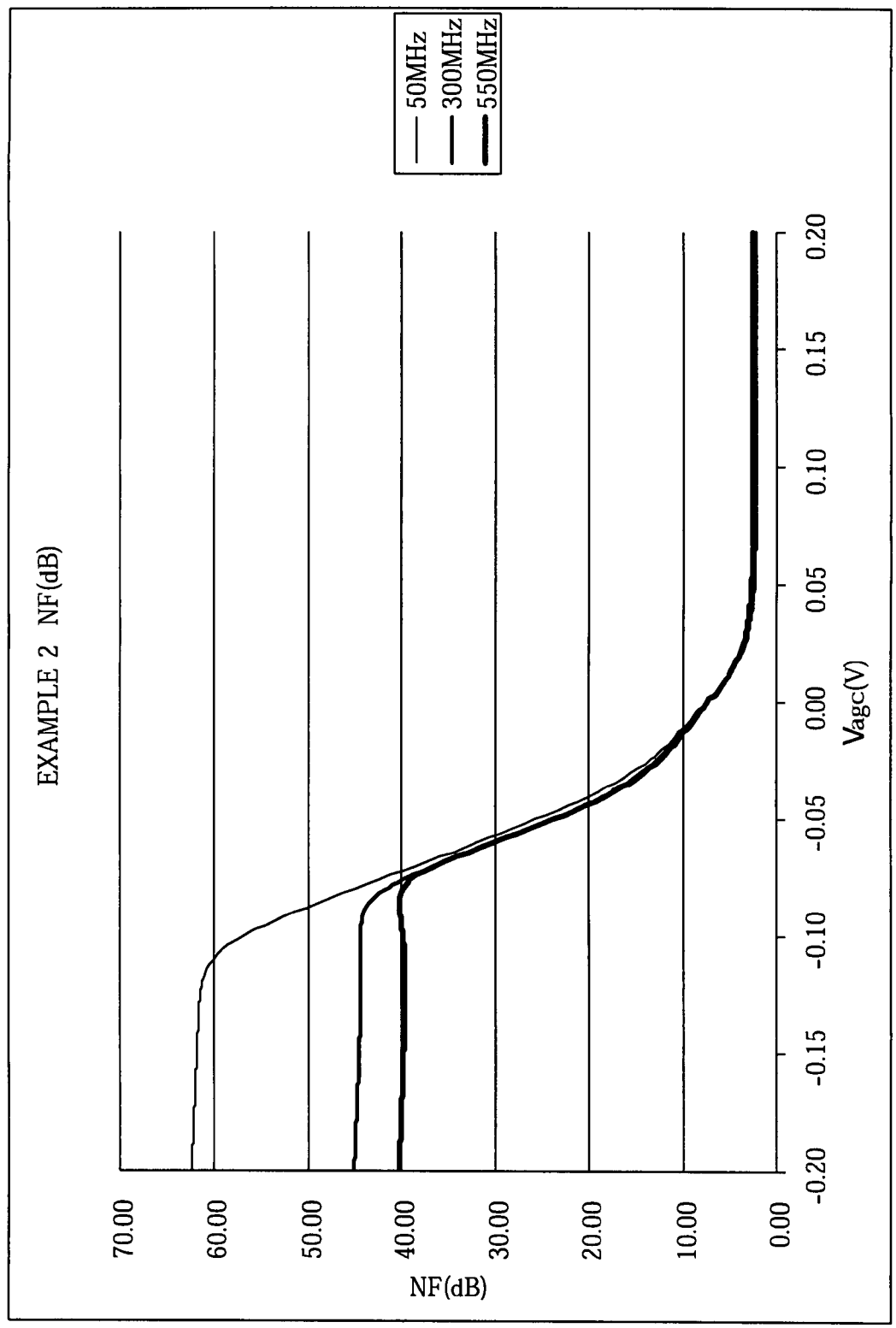
FIG. 5B is a graph plotting noise figure NF, in a case where the gain control voltage is changed in the differential amplifier of FIG. 4.
Figure 5C:
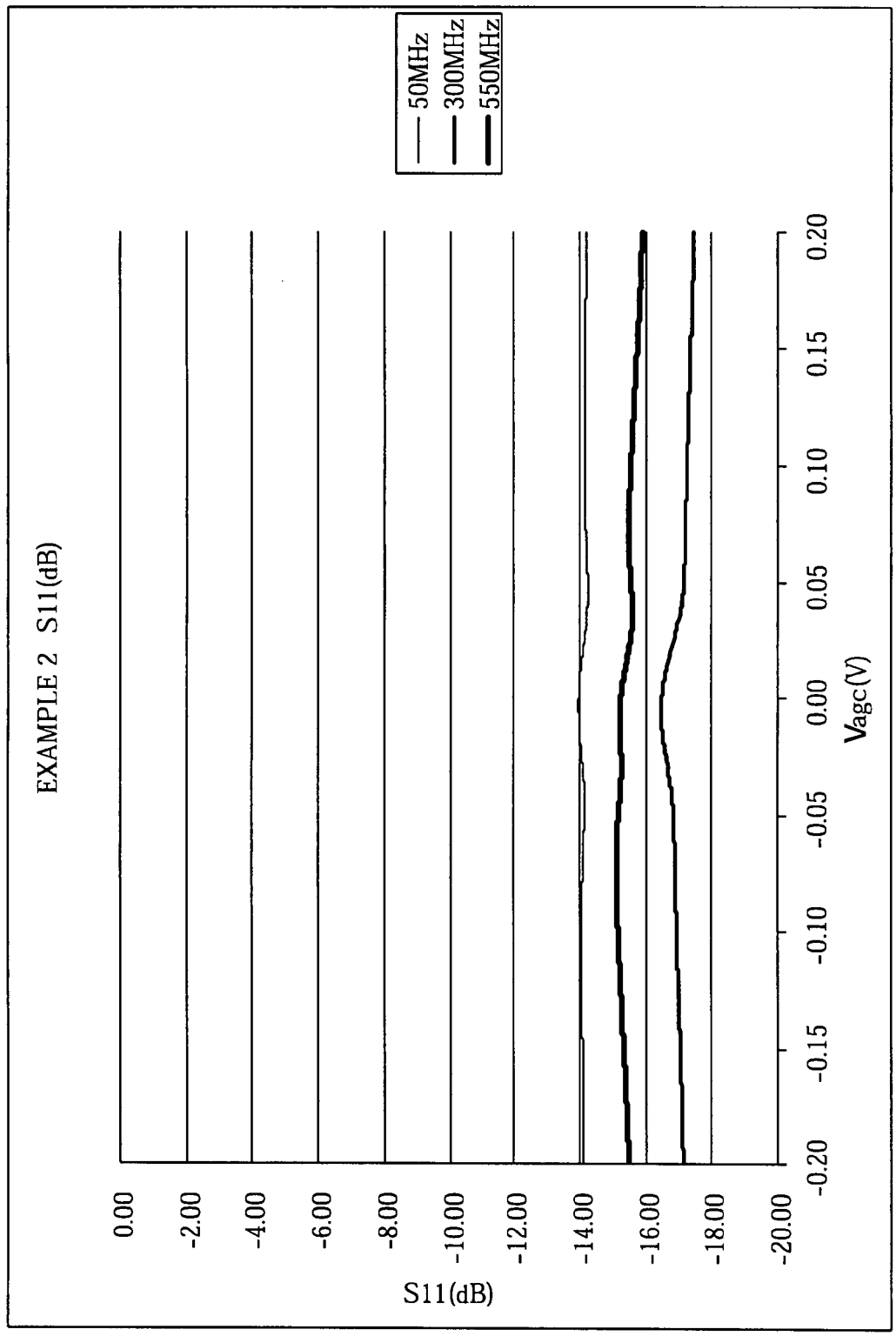
FIG. 5C is a graph plotting input reflection characteristic S11 of the S parameter, in a case where the gain control voltage is changed in the differential amplifier of FIG. 4.
Figure 5D:
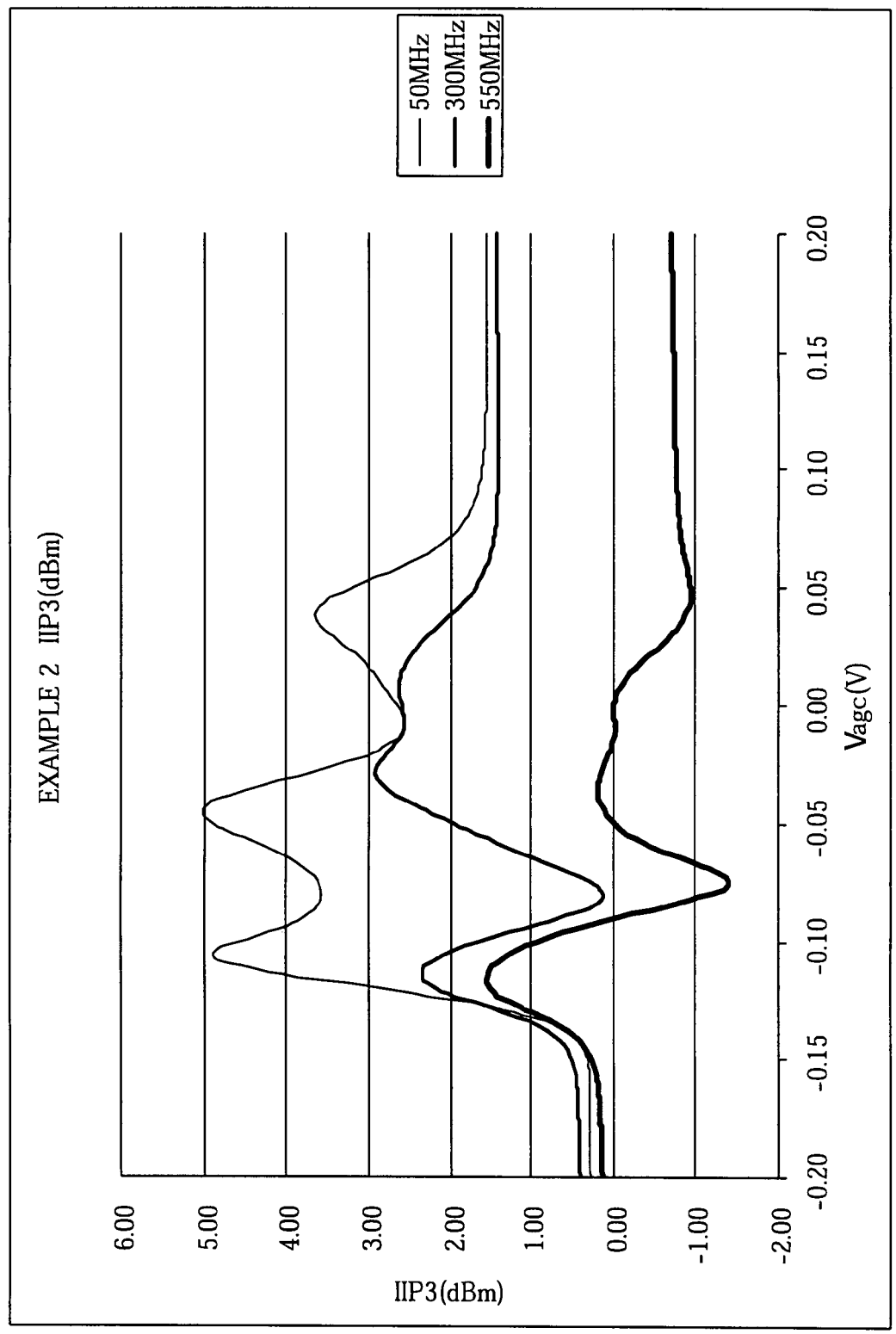
FIG. 5D is a graph plotting third order input intercept point IIP3, in a case where the gain control voltage is changed in the differential amplifier of FIG. 4.

How the gain changed when $V_{agc}$ was changed is represented by the graph of S21 shown in FIG. 5A. IIP3 was observed by conducting the simulations by inputting, at −50 dBm, two tone signals having center frequencies which were apart from the nominal measurement frequency by ±10 kHz. The conditions of the simulations were the same as those of the example 1. In FIGS. 5A to 5D, the bold line plots the simulation results at 550 MHz, the mid-size line plots at 300 MHz, and the thin line plots at 50 MHz, respectively.

FIG. 12 shows the noise figures (NF) observed at the maximum gains at the respective frequencies in the respective embodiments. The results of the conventional art 1 (FIG. 6), the conventional art 2 (FIG. 8), and the improved example with a negative feedback effect (FIG. 10) are also shown. The operational conditions of the variable amplifier, such as operating currents, etc. are the same in the respective examples.

In FIG. 12, the NFs at the maximum gains of the conventional art 2 (FIG. 8) are particularly large. This indicates that the attempts based on the conventional art 2 to realize similar input reflection characteristic and intermodulation distortion characteristic (FIG. 9C and FIG. 9D) to those of the other circuits entailed degeneration of the NFs at the maximum gains, because the amount of negative feedback of the circuit of FIG. 8 was small.

Figure 9A:
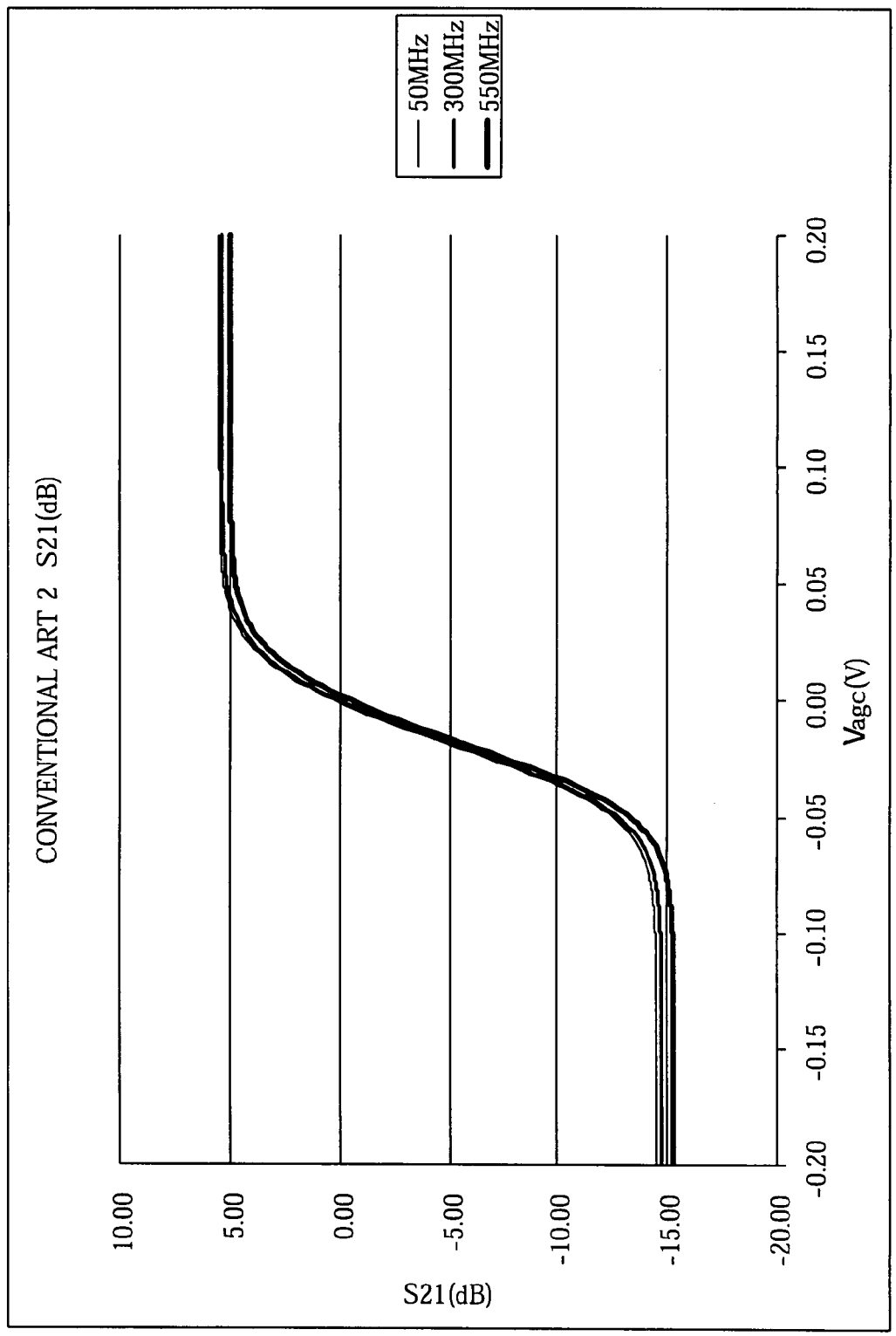
FIG. 9A is a graph plotting input transmission characteristic S21 of the S parameter, in a case where the gain control voltage is changed in the differential amplifier of FIG. 8.
Figure 9B:
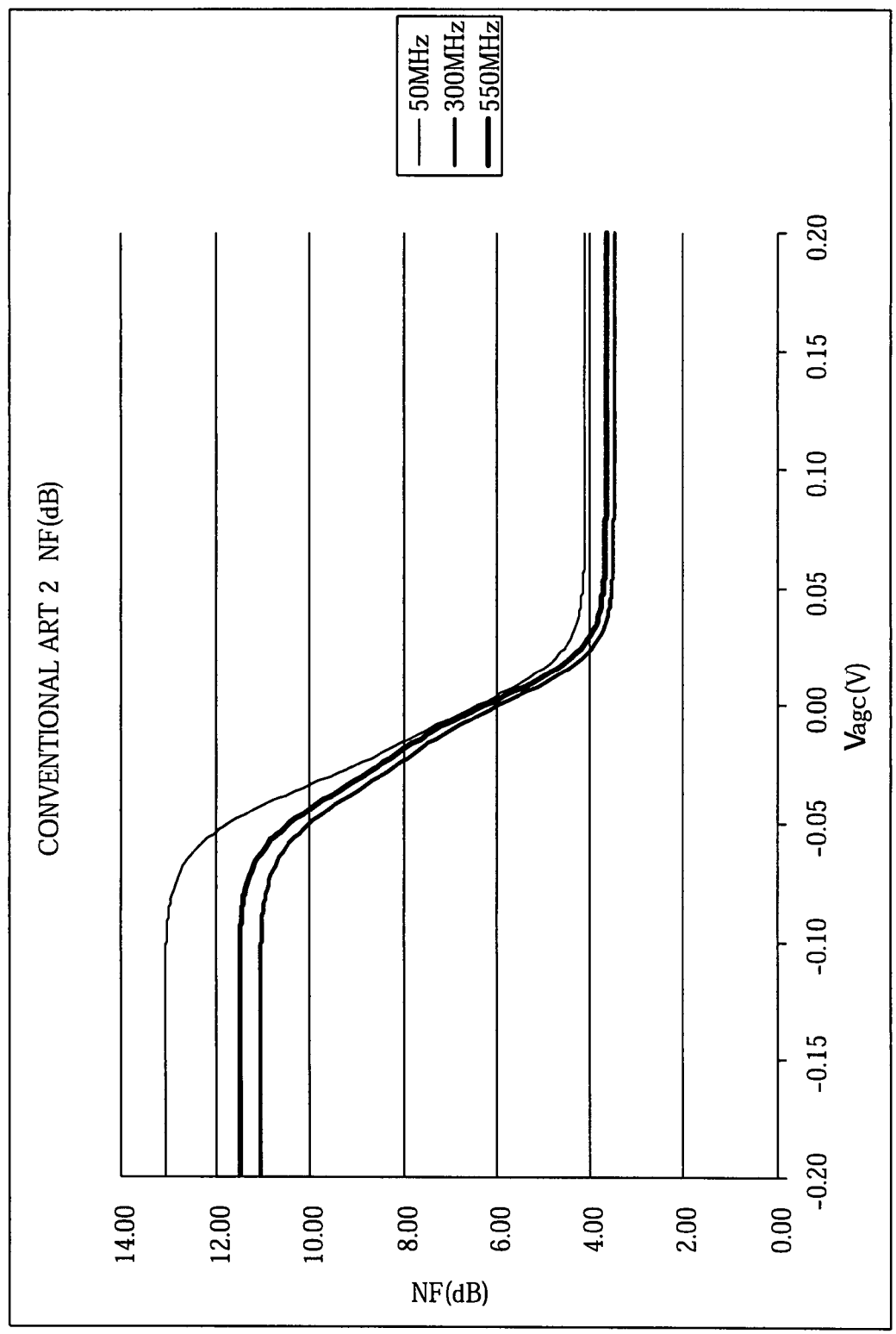
FIG. 9B is a graph plotting noise figure NF, in a case where the gain control voltage is changed in the differential amplifier of FIG. 8.
Figure 9C:
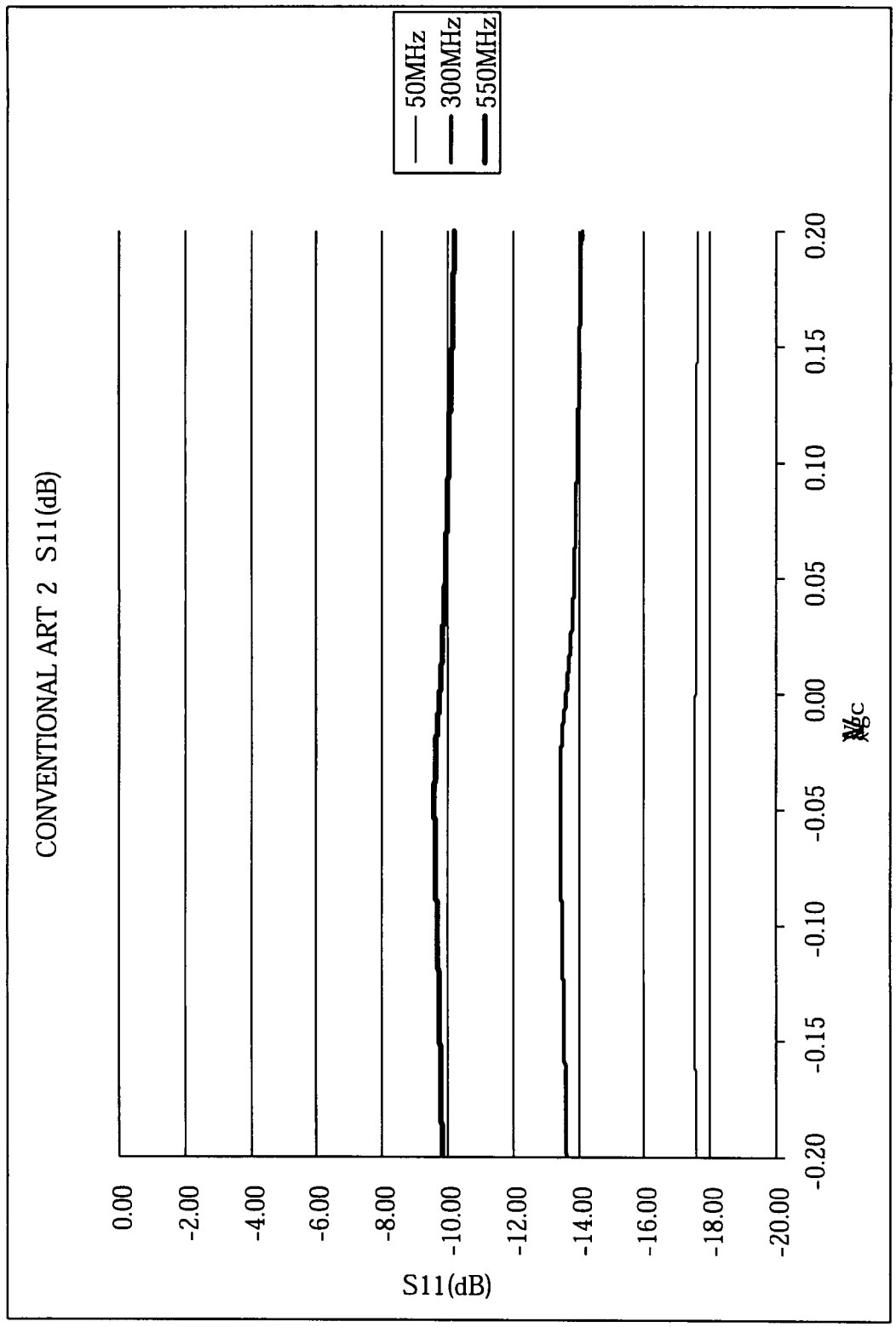
FIG. 9C is a graph plotting input reflection characteristic S11 of the S parameter, in a case where the gain control voltage is changed in the differential amplifier of FIG. 8.
Figure 9D:
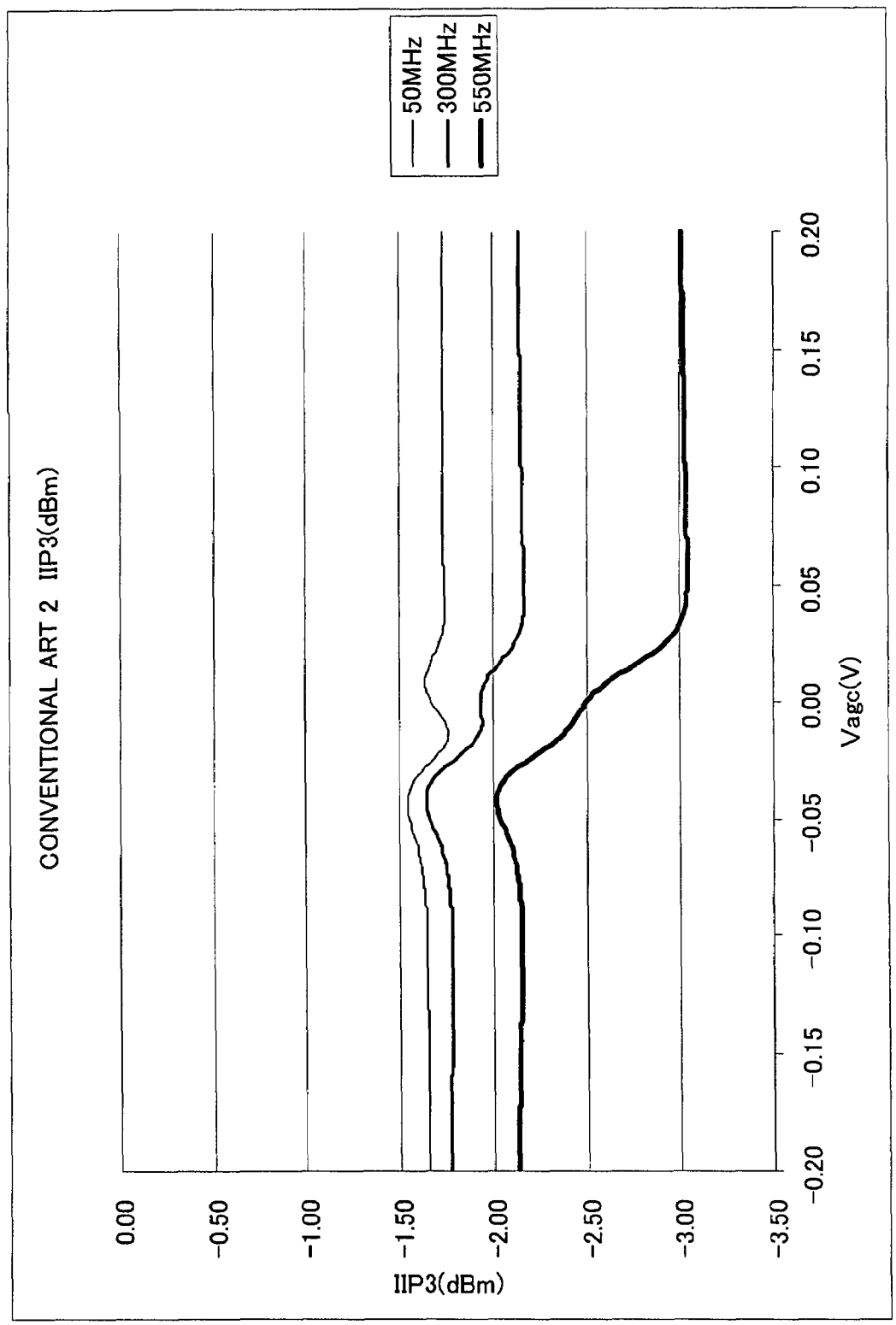
FIG. 9D is a graph plotting third order input intercept point IIP3, in a case where the gain control voltage is changed in the differential amplifier of FIG. 8.

In order to enable comparisons under fair conditions, the output loads 6a and 6b and the non-output loads 11a and 11b, which are connected to the collectors of the output-side Trs 4a and 4b and non-output side Trs 5a and 5b, all had the same resistance, in each embodiment shown in FIG. 12. Further, in the circuit of FIG. 8, the gain variable width was set to 20 dB as shown in FIG. 9A. In this case, the resistance of the resistors BM and BP was 1/10 of the resistance of the output loads 6a and 6b in the circuits of the other embodiments. That is, in the circuit of FIG. 8, the amplitude of the negative feedback signal was 1/10 of that of the negative feedback signals of the other embodiments, at the maximum gain. Therefore, in order that negative feedback of a similar amount may be achieved, the negative feedback resistors 12a and 12b in the circuit of FIG. 8 needed to have lower resistance than that of the feedback resistors 12a and 12b of the other embodiments. This simultaneously caused the increase in the noise.

To compare the circuit (FIG. 2) of the embodiment 2 and the improved example with a negative feedback effect (FIG. 10), the amount of improvement in the NFs at the maximum gains is only about 0.1 to 0.2 dB. This is because some operating currents flowed in the non-output side emitter followers (Trs) 63a and 63b in the circuit of FIG. 2 even when the gain was the maximum, as described above. The circuit (FIG. 4) of the embodiment 3 achieved close NF values to those of the circuit (FIG. 6) of the conventional art 1, at the maximum gain.

Even if there is a certain difference between the division ratio of the current dividing circuit 17a and the division ratio of the output side Tr 4a and non-output side Tr 5a in the left-hand side of the circuit of FIG. 2 and FIG. 4, and also a symmetrically equal difference between the division ratio of the current dividing circuit 17b and the division ratio of the output side Tr 4b and non-output side Tr 5b in the right-hand side of the circuit of FIG. 2 and FIG. 4, no abrupt degeneration occurs in the characteristics. For example, for the reason described above, the circuit of the embodiment 2 (FIG. 2) caused errors in the current division ratios. The circuit of the embodiment 2 (FIG. 2) achieved poor NFs at the maximum gains than those achieved by the circuit of the embodiment 3 (FIG. 4), but caused no notable degeneration in the other characteristics. It is possible to choose and use the appropriate one of the circuit of the embodiment 2 (FIG. 2) and the circuit of the embodiment 3 (FIG. 4), in consideration of constraints such as the frequency range to be used, the die area, etc.

As described above, according to the present invention, stable input reflection characteristic and distortion characteristic can be achieved over a wide frequency range regardless of the gain, with no increase in the current consumed and with no degeneration in the input-referred noise figure characteristic at the maximum gain. Further, the distortion characteristic is less likely to degenerate even in a high frequency range, than in he conventional art 2. Furthermore, according to the present invention, a gain variable width of 40 dB or wider can be realized over a wide frequency range.

Various embodiments and changes may be made thereunto without departing from the broad spirit and scope of the invention. The above-described embodiments are intended to illustrate the present invention, not to limit the scope of the present invention. The scope of the present invention is shown by the attached claims rather than the embodiments. Various modifications made within the meaning of an equivalent of the claims of the invention and within the claims are to be regarded to be in the scope of the resent invention.

This application is based on Japanese Patent Application No. 2006-152715 filed on May 31, 2006 and including specification, claims, drawings and summary. The disclosure of the above Japanese Patent Application is incorporated herein by reference in its entirety.

What is claimed is:

1. A variable gain amplifier having a signal amplifying transistor and gain control transistors at an output side and a non-output side, whose emitters are connected to a collector of said signal amplifying transistor, said amplifier comprising:
   a non-output load provided between a collector of said gain control transistor at the non-output side and a power source, and equal to an output load which is connected between a collector of said gain control transistor at the output side and said power source;
   a non-output side negative feedback path provided between the collector of said gain control transistor at the non-output side and an input terminal of said signal amplifying transistor, and formed in a same circuit form with a same circuit constant as those of a negative feedback path which runs from an output terminal of said gain control transistor at the output side to said input terminal; and
   a current dividing circuit which divides biasing currents between said negative feedback path and said non-output side negative feedback path to cause the biasing currents to flow to said paths at a same ratio as a current division ratio between said gain control transistor at the output side and said gain control transistor at the non-output side.

2. The variable gain amplifier according to claim 1, wherein said current dividing circuit comprises a differential transistor pair, which is of a same type as said gain control transistors at the output side and the non-output side, and
   an output from said differential transistor pair gives operating currents to said negative feedback path and said non-output side negative feedback path.

3. The variable gain amplifier according to claim 2, wherein an emitter area ratio between transistors of said differential transistor pair and said gain control transistors at the output side and the non-output side is equal to a ratio between an amount of an input current to said current dividing circuit and an amount of an input current to said gain control transistors at the output side and the non-output side.

4. The variable gain amplifier according to claim 2, wherein said gain control transistors at the output side and the non-output side are given, between bases thereof, a same potential difference as that that is given between bases of said differential transistor pair of said current dividing circuit.

5. The variable gain amplifier according to claim 1, wherein said negative feedback path and said non-output side negative feedback path are emitter followers.

6. A differential amplifier comprising two variable gain amplifiers each having a signal amplifying transistor and gain control transistors at an output side and a non-output side, whose emitters are connected to a collector of said signal amplifying transistor,
   wherein each of said variable gain amplifiers comprises:
      a non-output load provided between a collector of said gain control transistor at the non-output side and a power source, and equal to an output load which is connected between a collector of said gain control transistor at the output side and said power source; and
      a non-output side negative feedback path provided between the collector of said gain control transistor at the non-output side and an input terminal of said signal amplifying transistor, and formed in a same circuit form with a same circuit constant as those of a negative feedback path which runs from an output terminal of said gain control transistor at the output side to said input terminal, and
   said differential amplifier comprises two current dividing circuits which divide biasing currents between said negative feedback path and said non-output side negative feedback path to cause the biasing currents to flow into said negative feedback path and said non-output side negative feedback path respectively, at a same ratio as a current division ratio between said gain control transistor at the output side and said gain control transistor at the non-output side.

7. The differential amplifier according to claim 6, wherein each of said current dividing circuits comprises a differential transistor pair, which is of a same type as said gain control transistors at the output side and the non-output side, and
   an output from said differential transistor pair gives operating currents to said negative feedback path and said non-output side negative feedback path.

8. The differential amplifier according to claim 7, wherein an emitter area ratio between transistors of said differential transistor pair provided in each of said two current dividing circuits and said gain control transistors at the output side and the non-output side is equal to a ratio between an amount of an input current to each of said current dividing circuits and an amount of an input current to said gain control transistors at the output side and the non-output side.

9. The differential amplifier according to claim 7, wherein in each of said two variable gain amplifiers, said gain control transistors at the output side and the non-output side are given, between bases thereof, a same potential difference as that that is given between bases of said differential transistor pair of said current dividing circuit.

10. The differential amplifier according to claim 6, wherein said negative feedback path and said non-output side negative feedback path provided in each of said two variable gain amplifiers are emitter followers.

* * * * *